(12) United States Patent
Kawahito et al.

(10) Patent No.: US 10,453,880 B2
(45) Date of Patent: Oct. 22, 2019

(54) SEMICONDUCTOR ELEMENT AND SOLID-STATE IMAGING DEVICE

(71) Applicant: National University Corporation Shizuoka University, Shizuoka-shi, Shizuoka (JP)

(72) Inventors: Shoji Kawahito, Shizuoka (JP); Min-Woong Seo, Shizuoka (JP)

(73) Assignee: National University Corporation Shizuoka University, Shizuoka (JP)

( * ) Notice: Subject to any disclaimer, the term of this patent is extended or adjusted under 35 U.S.C. 154(b) by 0 days.

(21) Appl. No.: 15/760,743

(22) PCT Filed: Sep. 16, 2016

(86) PCT No.: PCT/JP2016/077507
§ 371 (c)(1),
(2) Date: Mar. 16, 2018

(87) PCT Pub. No.: WO2017/047774
PCT Pub. Date: Mar. 23, 2017

(65) Prior Publication Data
US 2018/0269242 A1    Sep. 20, 2018

(30) Foreign Application Priority Data
Sep. 18, 2015 (JP) ................. 2015-185718

(51) Int. Cl.
*H01L 27/146* (2006.01)
*H04N 5/357* (2011.01)
(Continued)

(52) U.S. Cl.
CPC .... *H01L 27/14612* (2013.01); *H01L 27/1461* (2013.01); *H04N 5/357* (2013.01);
(Continued)

(58) Field of Classification Search
CPC .......... H04N 5/357; H04N 7/18; G06T 7/246; G06T 1/00; G06T 7/00; G06T 7/0002; G06K 9/3241; G06N 3/08
See application file for complete search history.

(56) References Cited

U.S. PATENT DOCUMENTS 5,872,371 A    2/1999   Guidash et al.
8,183,657 B2   5/2012   Kuwazawa
(Continued)

FOREIGN PATENT DOCUMENTS

EP    0809299 A2    11/1997
EP    1091409 A2    4/2001
(Continued)

OTHER PUBLICATIONS

The extended European Search Report dated Jul. 4, 2019, in a counterpart European patent application.

*Primary Examiner* — Twyler L Haskins
*Assistant Examiner* — Fayez Bhuiyan
(74) *Attorney, Agent, or Firm* — Metrolexis Law Group, PLLC

(57) ABSTRACT

A semiconductor element includes a semiconductor region (11) of a first conductivity type, a buried charge-generation region (16) of a second conductivity type, buried in an upper portion of the semiconductor region (11) to implement a photodiode ($D_1$) together with the semiconductor region (11) to generate charges, a charge-readout region (15) of the second conductivity type, provided in the semiconductor region (11) to accumulate the charges transferred from the buried charge-generation region (16), and a reset-performing region (12) of the second conductivity type, provided in the semiconductor region (11), a variable voltage is applied to the reset-performing region (12) to change the height of a potential barrier generated in the semiconductor region (11) sandwiched between the charge-readout region (15) and the reset-performing region (12) to exhaust the charges accumulated in the charge-readout region (15). The semiconductor element has a high pixel conversion gain, ultralow noise of a photon counting level and implements a solid-state imaging device.

12 Claims, 32 Drawing Sheets

(51) Int. Cl.
*H04N 5/369* (2011.01)
*H04N 5/374* (2011.01)
*H04N 5/361* (2011.01)
*H04N 5/363* (2011.01)

(52) U.S. Cl.
CPC ............ *H04N 5/361* (2013.01); *H04N 5/369* (2013.01); *H04N 5/374* (2013.01); *H04N 5/3742* (2013.01); *H04N 5/3575* (2013.01); *H04N 5/363* (2013.01)

(56) References Cited

U.S. PATENT DOCUMENTS

| | | |
|---|---|---|
| 2006/0086996 A1 | 4/2006 | Kuwazawa |
| 2007/0290238 A1 | 12/2007 | Adachi |
| 2009/0140304 A1 | 6/2009 | Kudoh |
| 2010/0214459 A1 | 8/2010 | Kudoh |
| 2011/0063470 A1 | 3/2011 | Kudoh |
| 2011/0176041 A1 | 7/2011 | Kudoh |
| 2013/0037900 A1* | 2/2013 | Abe .................. H01L 27/14603 257/431 |
| 2013/0140610 A1 | 6/2013 | Kudoh |
| 2014/0367552 A1* | 12/2014 | Hynecek ........... H01L 27/14614 250/208.1 |
| 2015/0002717 A1 | 1/2015 | Kudoh |
| 2015/0171122 A1 | 6/2015 | Hynecek et al. |
| 2015/0318324 A1 | 11/2015 | Kudoh |

FOREIGN PATENT DOCUMENTS

| | | |
|---|---|---|
| JP | H7-106553 A | 4/1995 |
| JP | H9-65210 A | 3/1997 |
| JP | H10-70262 A | 3/1998 |
| JP | 2006-120966 A | 5/2006 |
| JP | 2007-335681 A | 12/2007 |
| JP | 2008-218756 A | 9/2008 |
| JP | 2008-227255 A | 9/2008 |
| JP | 2009-135319 A | 6/2009 |

\* cited by examiner

SEMICONDUCTOR ELEMENT AND SOLID-STATE IMAGING DEVICE

TECHNICAL FIELD

The present invention relates to a semiconductor element having a function of transferring and accumulating electrons generated by light and a solid-state imaging device in which a plurality of semiconductor elements are arranged one-dimensionally or two-dimensionally.

BACKGROUND ART

Since a low-noise imaging technology can be applied to various fields such as a biomedical field and a science field, the interest in low-noise imaging has been increasing in recent years. Although a circuit technology has progressed up to a noise level of around one noise electron, it is necessary to reduce the noise level further for the practical use of ultralow-noise imaging, which is called "photon counting".

Conventionally, in a CCD image sensor in which a p-type semiconductor region is sandwiched between a n-type floating diffusion layer and a n-type reset-drain region, a method in which a pulse voltage is applied directly to the reset-drain region when resetting signal charges of the floating diffusion layer to cause punch-through to occur in a semiconductor region sandwiched between the floating diffusion layer and the reset-drain region to exhaust charges is known as recited in Patent Literature (PTL)1. According to the structure disclosed in PTL 1, since the reset-gate electrode of the earlier technology is not necessary and a parasitic capacitance between the reset-gate electrode and the floating diffusion layer disappears, it is expected to be able to reduce the capacitance of the floating diffusion layer and to improve the sensitivity.

CITATION LIST

Patent Literature

PTL 1: JP H7(1996)-106553 A

SUMMARY OF INVENTION

Technical Problem

On the other hand, although a CMOS image sensor has been developed to realize the practical use of ultralow noise imaging, it is difficult to realize a high pixel conversion gain and ultralow noise of a photon counting level using the processes of a standard CMOS image sensor.

An object of the present invention is to provide a semiconductor element capable of a high pixel conversion gain and ultralow noise of a photon counting level and a solid-state imaging device which uses the semiconductor element as a sensor element or a pixel.

Solution to Problem

A first aspect of the present invention inheres in a semiconductor element encompassing (a) a semiconductor region of a first conductivity type, (b) a buried charge-generation region of a second conductivity type, buried in an upper portion of the semiconductor region to implement a photodiode together with the semiconductor region for generating charges, (c) a charge-readout region of the second conductivity type, disposed in another portion of the semiconductor region to be separated from the buried charge-generation region for accumulating the charges transferred from the buried charge-generation region, (d) a charge transfer mechanism configured to control the transfer of the charges from the buried charge-generation region to the charge-readout region and (e) a reset-performing region of the second conductivity type, disposed in still another portion of the semiconductor region to be separated from the charge-readout region. In the semiconductor element pertaining to the first aspect of the present invention, a variable voltage is applied to the reset-performing region so as to change a height of a potential barrier generated in the semiconductor region sandwiched between the charge-readout region and the reset-performing region, and the charges accumulated in the charge-readout region are exhausted.

A second aspect of the present invention inheres in a solid-state imaging device in which a plurality of pixels are arranged, each of the pixel encompassing (a) a semiconductor region of a first conductivity type, (b) a buried charge-generation region of a second conductivity type, buried in an upper portion of the semiconductor region to implement a photodiode together with the semiconductor region for generating charges, (c) a charge-readout region of the second conductivity type, disposed in another portion of the semiconductor region to be separated from the buried charge-generation region for accumulating the charges transferred from the buried charge-generation region, (d) a charge transfer mechanism configured to control the transfer of the charges from the buried charge-generation region to the charge-readout region, and (e) a reset-performing region of the second conductivity type, disposed in still another portion of the semiconductor region to be separated from the charge-readout region. In the solid-state imaging device pertaining to the second aspect of the present invention, a variable voltage is applied to the reset-performing region so as to change a height of a potential barrier generated in the semiconductor region sandwiched between the charge-readout region and the reset-performing region, and the charges accumulated in the charge-readout region are exhausted.

Advantageous Effects of Invention

According to the present invention, it is possible to provide a semiconductor element capable of a high pixel conversion gain and ultralow noise of a photon counting level and a solid-state imaging device which uses the semiconductor element as a sensor element (a pixel).

DESCRIPTION OF EMBODIMENTS

Figure 1:
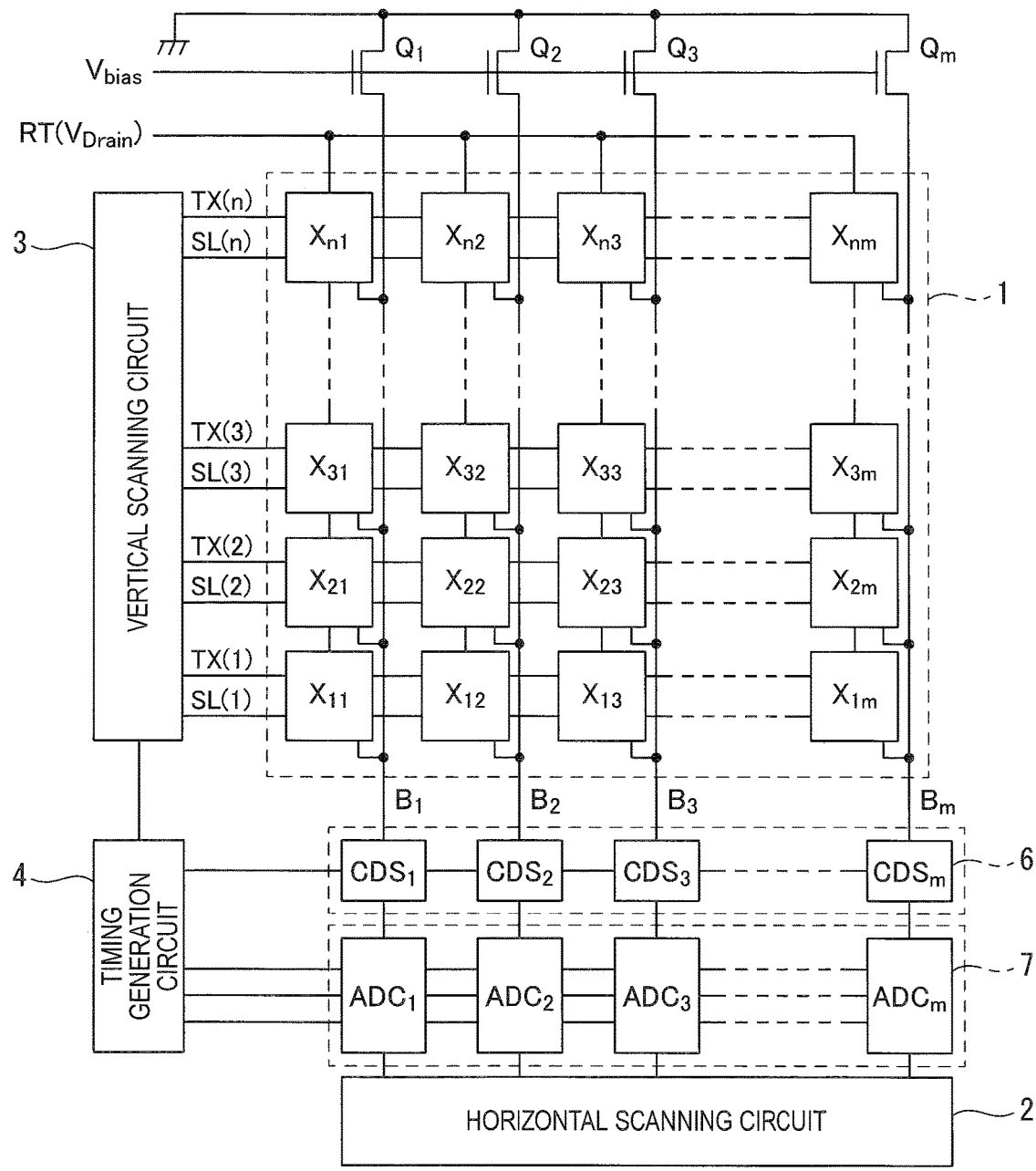
FIG. 1 is a schematic plan view illustrating a layout on a semiconductor chip of a solid-state imaging device (a two-dimensional image sensor) according to a first embodiment of the present invention.

Hereinafter, first to fourth embodiments of the present invention will be described. Note that, in the following description of the Drawings, the same or similar reference numerals denote the same or similar elements and portions. In addition, it should be noted that the Drawings are schematic and the relationship between thickness and planar dimensions, the ratios of dimensions, and the like are different from actual ones. Therefore, specific thicknesses and dimensions should be determined in consideration of the following description. Moreover, the Drawings also include portions having different dimensional relationships and ratios from each other.

The first to fourth embodiments illustrated below mere examples of the devices and methods for embodying the technical idea of the present invention, the first to third embodiments can be applied to a solid-state bioimaging device that measures the fluorescence from a dyed biological cell or the life of fluorescence, or various solid-state imaging devices such as a temporal correlation image sensor and the like, for carrying out various measurements. Also, in the technical idea of the present invention, the material quality, shape, structure, arrangement and the like of a configuration part are not limited to the followings, and various changes can be added to the technical idea of the present invention, within the technical scopes prescribed by claims.

In the following description of first to fourth embodiments, although a case in which "a first conductivity type" is a p-type and "a second conductivity type" is an n-type is assigned as an example, the conductivity type may be selected in a reverse relation such that the first conductivity type is an n-type and the second conductivity type is a p-type. When the first conductivity type is a p-type and the second conductivity type is an n-type, the carrier as a signal charge is naturally an electron. When the first conductivity type is an n-type and the second conductivity type is a p-type, the carriers as signal charges are naturally holes. Moreover, in the following description, the directions "left-right" and "up-down" are definitions used for the sake of convenience, and such definitions do not limit the technical ideas of the present invention. Thus, for example, when the orientation of the paper is rotated by 90 degrees, "left-right" and "up-down" shall be read mutually exchanged. When the paper is rotated by 180 degrees, naturally, "the left" is changed to "the right" and "the right" is changed to "the left".

(First Embodiment)

In a solid-state imaging device (a two-dimensional image sensor) according to a first embodiment of the present invention, as illustrated in FIG. 1, a pixel array unit 1 and peripheral circuit units (2, 3, 4, 6, and 7) are merged on a same semiconductor chip. In the pixel array unit 1, a large number of pixels $X_{ij}$ (i=1 to m; j=1 to n: where m, n are integers, respectively) are arranged in a two-dimensional matrix form, and for example, a rectangular imaging region is formed. On the lower side of the pixel array unit 1, a horizontal scanning circuit 2 is provided along the directions of pixel rows $X_{11}$, $X_{12}$, $X_{13}$, . . . , and $X_{1m}$; $X_{21}$, $X_{22}$, $X_{23}$, . . . , and $X_{2m}$; $X_{31}$, $X_{32}$, $X_{33}$, . . . , and $X_{3m}$; . . . ; and; $X_{n1}$, $X_{n2}$, $X_{n3}$, . . . , and $X_{nm}$. On the left side of the pixel array unit 1, a vertical scanning circuit 3 is provided along the directions of pixel columns $X_{11}$, $X_{21}$, $X_{31}$, . . . , and $X_{n1}$; $X_{12}$, $X_{22}$, $X_{32}$, . . . , and $X_{n2}$; $X_{13}$, $X_{23}$, $X_{33}$, . . . , and $X_{n3}$; . . . ; and; $X_{1m}$, $X_{2m}$, $X_{3m}$, . . . , and $X_{nm}$. A timing generation circuit 4 is connected to the vertical scanning circuit 3 and the horizontal scanning circuit 2.

The timing generation circuit 4, the horizontal scanning circuit 2, and the vertical scanning circuit 3 sequentially scan unit pixels $X_{ij}$ in the pixel array unit 1 whereby a pixel signal readout operation and an electronic-shutter mode operation are executed. That is, in the solid-state imaging device according to the first embodiment, the pixel array unit 1 is vertically scanned in units of the pixel rows $X_{11}$, $X_{12}$, $X_{13}$, . . . , and $X_{1m}$; $X_{21}$, $X_{22}$, $X_{23}$, . . . , and $X_{2m}$; $X_{31}$, $X_{32}$, $X_{33}$, . . . , and $X_{3m}$; . . . ; and; $X_{n1}$, $X_{n2}$, $X_{n3}$, . . . , and $X_{nm}$, whereby the pixel signals of the pixel rows $X_{11}$, $X_{12}$, $X_{13}$, . . . , and $X_{1m}$; $X_{21}$, $X_{22}$, $X_{23}$, . . . , and $X_{2m}$; $X_{31}$, $X_{32}$, $X_{33}$, . . . , and $X_{3m}$; . . . ; and; $X_{n1}$, $X_{n2}$, $X_{n3}$, . . . , and $X_{nm}$ are read by vertical signal lines $B_1$, $B_2$, $B_3$, . . . , and $B_m$ provided in the respective pixel columns $X_{11}$, $X_{21}$, $X_{31}$, . . . , and $X_{n1}$; $X_{12}$, $X_{22}$, $X_{32}$, . . . , and $X_{n2}$; $X_{13}$, $X_{23}$, $X_{33}$, . . . , and $X_{n3}$; . . . ; and; $X_{1m}$, $X_{2m}$, $X_{3m}$, . . . , and $X_{nm}$.

The pixel signals read from the vertical signal lines $B_1$, $B_2$, $B_3$, . . . , and $B_m$ are processed by correlated double sampling circuits $CDS_1$, $CDS_2$, $CDS_3$, . . . , and $CDS_m$ of a noise canceling circuit 6. The pixel signals are processed by analog-digital conversion circuits $ADC_1$, $ADC_2$, $ADC_3$, . . . , and $ADC_m$ of a signal processing circuit 7. After that, the pixel signals are transferred to an external circuit (not illustrated) as imaging signals.

Figure 2:
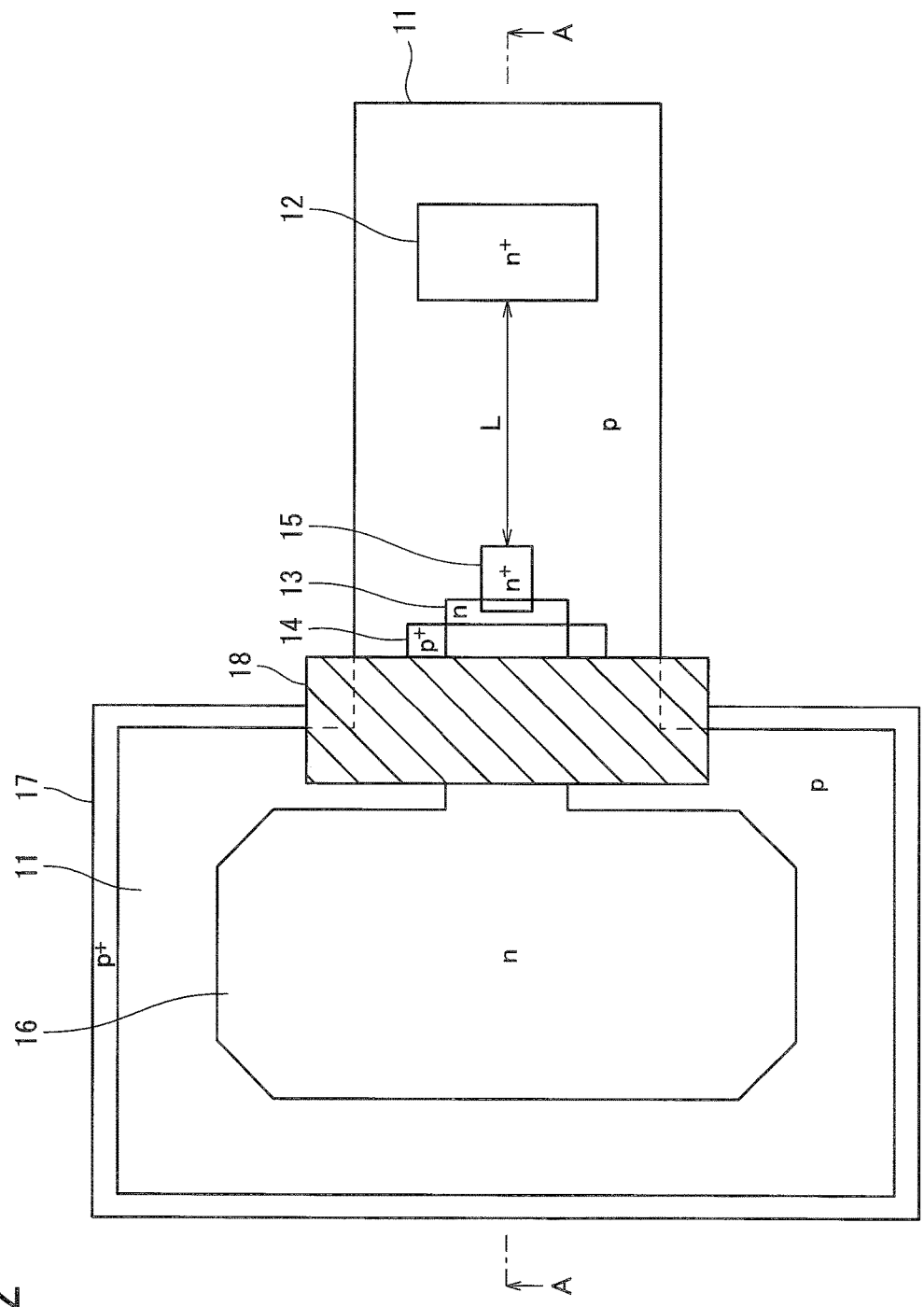
FIG. 2 is a schematic plan view illustrating a structure of a semiconductor element which forms a part of a pixel of the solid-state imaging device according to the first embodiment.
Figure 3:
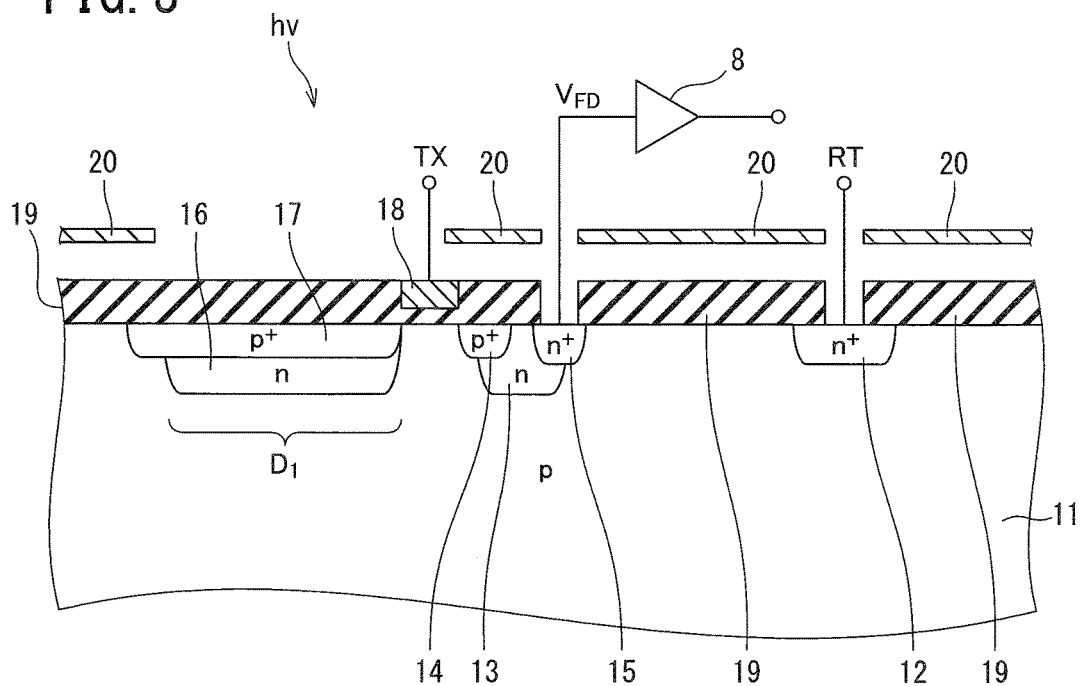
FIG. 3 is a schematic cross-sectional view seen from the direction A-A in FIG. 2.

FIG. 2 illustrates an example of a planar structure of a semiconductor element functioning as respective pixels $X_{ij}$ of the solid-state imaging device according to the first embodiment, and FIG. 3 is a corresponding cross-sectional view taken from the direction A-A, of the semiconductor element in the plan view of FIG. 2. As illustrated in FIG. 3, the semiconductor element that forms a part of the pixel $X_{ij}$ includes a semiconductor region 11 of a first conductivity type (a p-type), a buried charge-generation region (a light-receiving cathode region) 16 of a second conductivity type (a n-type) which is buried in an upper portion of the semiconductor region 11 and on which light is incident, a charge-readout region 15 of the second conductivity type (a $n^+$-type) which is buried in a portion of the upper portion of the semiconductor region 11 in a state of being separated toward the right side from the buried charge-generation region 16 and in which charges generated in the buried charge-generation region 16 are accumulated, a charge-guiding region 13 of the second conductivity type (the n-type) which is buried in a portion of the upper portion of the semiconductor region 11 in contact with the charge-readout region 15 to guide the charges generated in the buried charge-generation region 16 toward the charge-readout region 15 and which has a lower impurity concentration than that of the charge-readout region 15, and a reset-performing region 12 of the second conductivity type (the $n^+$-type) which is buried in a portion of the upper portion of the semiconductor region 11 in a state of being separated toward the right side from the charge-readout region 15. In the first embodiment, the charge-readout region 15 and the charge-guiding region 13 perform the function of the charge-readout region.

The buried charge-generation region 16 and a semiconductor region (an anode region) 11 immediately below the buried charge-generation region 16 form a buried photodiode (hereinafter referred to simply as a "photodiode") $D_1$. As illustrated in FIG. 3, a light-shielding film 20 has openings selectively formed so that photo-charges are generated in the semiconductor region 11 immediately below the buried charge-generation region 16 that implements the photodiode. Although FIG. 3 illustrates the gate insulating film 19 only, the light-shielding film 20 may be formed of a thin metallic film of aluminum (Al) or the like formed on an upper portion of any one of a plurality of interlayer insulating films forming a multilevel wiring structure (not illustrated).

A pinning layer 17 of the first conductivity type (a $p^+$-type) is disposed on the buried charge-generation region 16. A pinning layer 14 of the first conductivity type (the $p^+$-type) is disposed on a portion of the charge-guiding region 13. The pinning layers 14 and 17 are layers for suppressing generation of carriers and capturing of signal carriers at a surface in the event of dark current, and the pinning layers 14 and 17 are used as preferable layers for suppressing dark current and capturing the signal carriers.

FIG. 3 illustrates a case in which the semiconductor region 11 of the first conductivity type is used as a "semiconductor region of a first conductivity type". However, instead of the semiconductor region 11, a silicon epitaxial growth layer of the first conductivity type (the p-type) having a lower impurity concentration than that of the semiconductor substrate may be grown on a semiconductor substrate of the first conductivity type (the p-type) and the epitaxial growth layer may be used as the semiconductor region of the first conductivity type. Moreover, a silicon epitaxial growth layer of the first conductivity type (the p-type) may be grown on a semiconductor substrate of the second conductivity type (the n-type) and the epitaxial growth layer may be used as the semiconductor region of the first conductivity type. When the epitaxial growth layer of the first conductivity type (the p-type) is grown on the semiconductor substrate of the second conductivity type (the n-type) so that a p-n junction is formed, light of a longer wavelength enters deep into the semiconductor substrate of the second conductivity type. However, since carriers resulting from light generated in the semiconductor substrate of the second conductivity type cannot enter deep into the epitaxial growth layer of the first conductivity type due to a potential barrier resulting from a built-in potential of the p-n junction, it is possible to actively exhaust the carriers generated deep in the semiconductor substrate of the second conductivity type. Due to the potential barrier ascribable to the built-in potential of the p-n junction, it is possible to prevent the carriers generated at deep positions from returning by diffusion and leaking into neighboring pixels, which provides an advantageous effect that colors are not mixed in a case of a single-chip color image sensor on which RGB color filters are mounted particularly.

The semiconductor region 11 preferably has an impurity concentration of approximately $5\times10^{12}$ cm$^{-3}$ or higher and approximately $5\times10^{16}$ cm$^{-3}$ or lower. The impurity concentration of the charge-guiding region 13 is set to be higher than that of the buried charge-generation region 16 so that the bottom potential of a potential valley with respect to the majority carrier of the charge-guiding region 13 is deeper than the bottom potential of a potential valley generated by the buried charge-generation region 16 (see FIG. 7). For example, the buried charge-generation region 16 has an impurity concentration of approximately $1\times10^{17}$ cm$^{-3}$ or higher and approximately $8\times10^{18}$ cm$^{-3}$ or lower, preferably approximately $2\times10^{17}$ cm$^{-3}$ or higher and approximately $1\times10^{18}$ cm$^{-3}$ or lower, and typically, for example, approximately $8\times10^{17}$ cm$^{-3}$ at which the depletion of mobile carriers is achieved relatively easily. The thickness of the buried charge-generation region 16 is between approximately 0.1 micrometer and 3 micrometers, and preferably approximately 0.1 micrometer and 0.3 micrometer.

On the other hand, the charge-guiding region 13 has an impurity concentration of approximately $1\times10^{17}$ cm$^{-3}$ or higher and approximately $8\times10^{18}$ cm$^{-3}$ or lower. Preferably, the impurity concentration of the charge-guiding region 13 may be approximately $4\times10^{17}$ cm$^{-3}$ or higher and approximately $2\times10^{18}$ cm$^{-3}$ or lower. And typically, the impurity concentration of the charge-guiding region 13 may be, for example, approximately $1.6\times10^{18}$ cm$^{-3}$. The thickness of the charge-guiding region 13 is between approximately 0.1 micrometer and 3 micrometers, and preferably approximately 0.1 micrometer and 0.3 micrometer. When the impurity concentration of the charge-guiding region 13 is set to approximately 1.2 to 5 times and preferably approximately 1.5 to 2.5 times the impurity concentration of the buried charge-generation region 16, the bottom potential of the potential valley of the charge-guiding region 13 is appropriately deeper than the bottom potential of the potential valley generated by the buried charge-generation region 16.

The impurity concentration of the reset-performing region 12 is approximately $2\times10^{18}$ cm$^{-3}$ to $1\times10^{21}$ cm$^{-3}$. The impurity concentration of the pinning layers 14 and 17 is approximately $2.3\times10^{17}$ cm$^{-3}$. The impurity concentration of the charge-readout region 15 is approximately $5\times10^{18}$ cm$^{-3}$ to $1\times10^{21}$ cm$^{-3}$. The charge-guiding region 13 may be omitted and charges may be transferred from the buried charge-generation region 16 to the charge-readout region 15 via a channel portion. Conversely, when the charge-readout region 15 is omitted, the charge-guiding region 13 may function as the charge-readout region.

A gate insulating film 19 is formed on the pinning layers 14 and 17, the semiconductor region 11 between the pinning layers 14 and 17, and the semiconductor region 11 between the reset-performing region 12 and the charge-guiding region 13. A silicon oxide film (a SiO$_2$ film) is preferable as the gate insulating film 19. However, other than the silicon oxide film, the gate insulating film 19 may be implemented by various insulating films so as to establish an insulated gate structure of a more generic insulated gate transistor, or "a MIS transistor". For example, an ONO film made up a stacked film of triple layers of a silicon oxide film, a silicon nitride film (a Si$_3$N$_4$ film), and a silicon oxide film may be used. Moreover, an oxide film that includes at least one element of strontium (Sr), aluminum (Al), magnesium (Mg), yttrium (Y), hafnium (Hf), zirconium (Zr), tantalum (Ta) and bismuth (Bi), a silicon nitride that includes these elements, and the like can be used as the gate insulating film 19.

When the gate insulating film 19 is formed of a thermal oxide film, the thickness of the thermal oxide film is approximately 150 nm or larger and approximately 1000 nm or smaller, and preferably approximately 200 nm or more and approximately 400 nm or smaller. When the gate insulating film 19 is formed of a dielectric film other than the thermal oxide film, the thickness of the dielectric film may be an equivalent thickness converted with respect to a relative dielectric constant $\varepsilon_r$ ($\varepsilon_r$=3.8 at 1 MHz) of the thermal oxide film. For example, when a CVD oxide film having a relative dielectric constant $\varepsilon_r$ of 4.4 is used, the oxide film may have a thickness obtained by multiplying the above-mentioned thickness by 1.16 (=4.4/3.8). When a silicon nitride ($Si_3N_4$) film having a relative dielectric constant $\varepsilon_r$ of 7 is used as the gate insulating film 19, the silicon nitride film may have a thickness obtained by multiplying the above-mentioned thickness by 1.84 (=7/3.8). However, it is preferable to use an oxide film (a $SiO_2$ film) formed by the standard CMOS technique as the gate insulating film 19, and it is appropriate to use a field oxide film in the CMOS technique as the gate insulating film 19 from the perspective of simplifying the manufacturing processes.

A transfer-gate electrode 18 is disposed in the upper portion of the gate insulating film 19 between the buried charge-generation region 16 and the charge-readout region 15. The transfer-gate electrode 18 controls the potential of a transfer channel formed between the buried charge-generation region 16 and the charge-readout region 15 and transfers electrons generated in the buried charge-generation region 16 to the charge-readout region 15. Moreover, the gate insulating film 19 and the transfer-gate electrode 18 on the gate insulating film 19 form charge transfer mechanism (18, 19) that controls the potential of a channel disposed in the upper portion of the semiconductor region 11 between the buried charge-generation region 16 and the charge-readout region 15. And the charge transfer mechanism (18, 19) transfers charges from the buried charge-generation region 16 to the charge-readout region 15.

Figure 4:
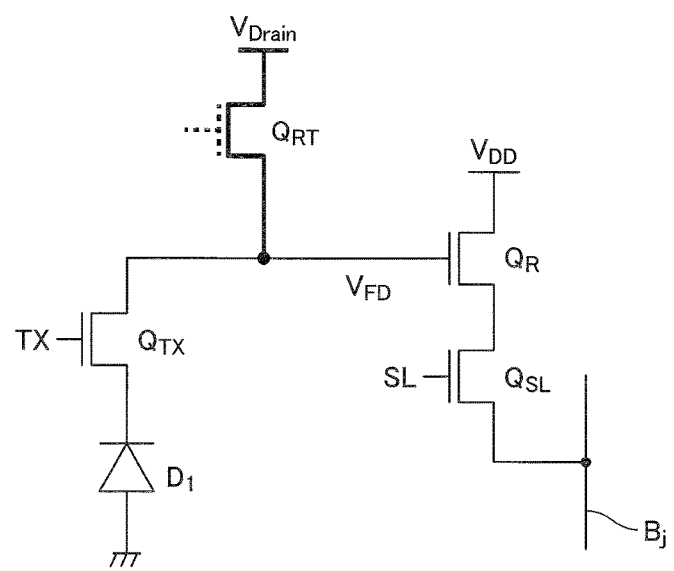
FIG. 4 is an equivalent circuit diagram of the semiconductor element according to the first embodiment.

FIG. 4 illustrates an equivalent circuit of a signal-readout circuit 8 of the semiconductor element illustrated in FIG. 3. A transfer transistor $Q_{TX}$ constructed by the charge transfer mechanism (18, 19) is connected to a photodiode $D_1$ implemented by the semiconductor region 11 and the buried charge-generation region 16. A control signal TX is applied to the transfer-gate electrode 18 of the transfer transistor $Q_{TX}$. A gate electrode of the readout-transistor $Q_R$ is connected to the charge-readout region 15 indicated by one of the main electrodes of the transfer transistor $Q_{TX}$. A drain region of the readout-transistor $Q_R$ is connected to a power supply $V_{DD}$, and a source region of the readout-transistor $Q_R$ is connected to a drain region of a pixel-selecting switching-transistor $Q_{SL}$. A selection control signal SL is applied to the gate electrode of the switching-transistor $Q_{SL}$. A source region of the switching-transistor $Q_{SL}$ is connected to a vertical signal line $B_j$.

The semiconductor element according to the first embodiment is characterized in that the structure does not include a reset transistor. FIG. 4 schematically illustrates the function of the reset-performing region 12 illustrated in FIG. 3, and the reset mechanism $Q_{RT}$ is represented by a electronic symbol similar to a transistor symbol which includes a gate electrode illustrated by a broken line. The broken line represents a structure modeling of the reset mechanism $Q_{RT}$, by which the reset operation can be performed without using a reset electrode, which is known as a gate electrode of MOSFET.

Figure 5:
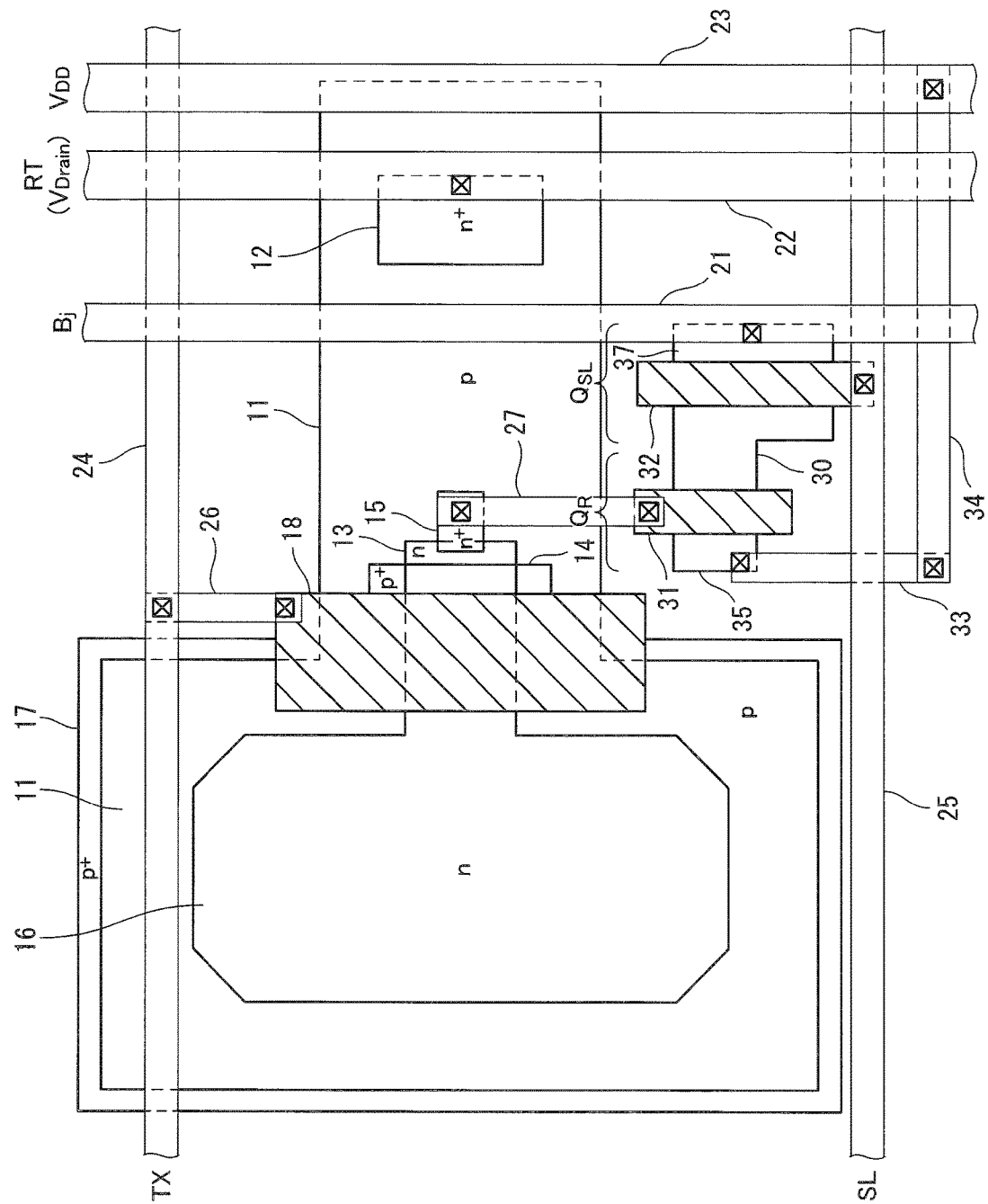
FIG. 5 is a schematic plan view in which a readout-transistor (an amplification-transistor), a pixel-selecting switching-transistor, surface interconnections, and the like are added to the structure of the semiconductor element illustrated in FIG. 2.

As illustrated in FIG. 5, the gate electrode 31 of the readout-transistor $Q_R$, which builds up the signal-readout circuit 8, is connected to the charge-readout region 15 of the pixel $X_{ij}$ via the surface interconnection 27. The drain region 35 of the readout-transistor $Q_R$ is connected to the power supply $V_{DD}$ via surface interconnections 33, 34, and 23, and the source region of the readout-transistor $Q_R$ forms a common region 30 that is shared with the drain region of the pixel-selecting switching-transistor $Q_{SL}$. A source region 37 of the pixel-selecting switching-transistor $Q_{SL}$ is connected to a surface interconnection 21 (a vertical signal line $B_j$), and a selection control signal SL(i) of a horizontal line is applied from the vertical scanning circuit 3 to the gate electrode 32 via a surface interconnection 25. When the selection control signal SL(i) is put into a high (H) level, the switching-transistor $Q_{SL}$ enters into a conduction state and a current corresponding to the potential of the charge-readout region 15 amplified by the readout-transistor (an amplification-transistor) $Q_R$ flows through the surface interconnection 21 (the vertical signal line $B_j$).

On the other hand, a reset signal RT(i) is applied to the reset-performing region 12 via a reset interconnection 22. In the first embodiment, a variable voltage $V_{Drain}$ is applied to the reset-performing region 12 to exhaust the charges accumulated in the charge-readout region 15 so that he height of a potential barrier (a reset potential barrier) generated in the semiconductor region 11 sandwiched between the charge-readout region 15 and the reset-performing region 12 is changed. For example, when a voltage of a high (H) level having a voltage $V_{Drain}$ of approximately 20 volts is applied as the reset signal RT(i), the height of the reset potential barrier generated in the semiconductor region 11 sandwiched between the reset-performing region 12 and the charge-readout region 15 is lowered to exhaust a predetermined amount of charge which is the majority carriers accumulated in the charge-readout region 15 to put the charge-readout region 15 into a reset level. That is, even when a reset transistor having a reset-gate electrode is not provided, it is possible to put the charge-readout region 15 into a reset level.

Figure 6:
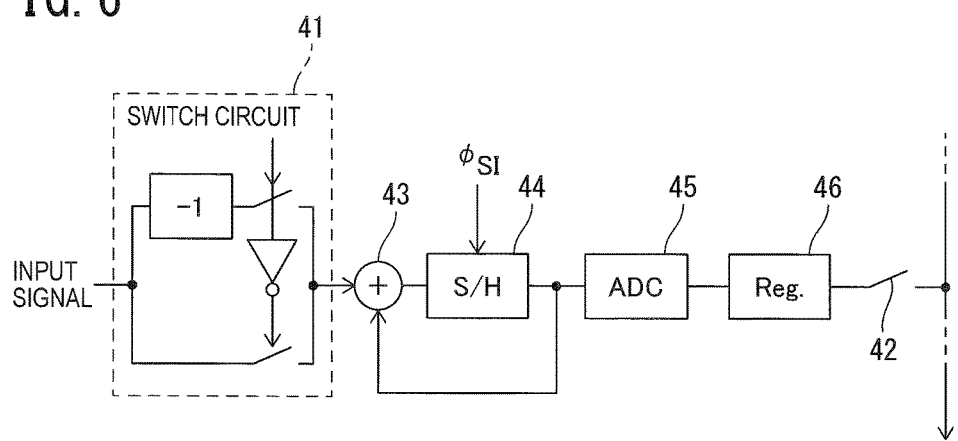
FIG. 6 is a circuit diagram illustrating an example of a structure of a correlated double sampling circuit and an analog-digital conversion circuit of the solid-state imaging device according to the first embodiment.

As illustrated in FIG. 6, each of circuit structures formed by the correlated double sampling circuit $CDS_j$ and the analog-digital conversion circuit $ADC_j$ illustrated in FIG. 1 includes a switch circuit 41, an adder 43 connected to an output side of the switch circuit 41, a sample/hold (S/H) circuit 44 connected to an output side of the adder 43, an analog-to-digital converter (ADC) 45 connected to an output side of the S/H circuit 44, and a register 46 connected to an output side of the ADC 45. The adder 43 and the sample/hold circuit 44 form an integrator.

An input signal is fed from the vertical signal line $B_j$ to the switch circuit 41. The switch circuit 41 transfers either an input signal or a signal of a reset level having a polarity (−1) opposite to that of the input signal. The adder 43 adds an input signal or a signal of a reset level delivered from the switch circuit 41 and a signal fed-back from the sample/hold circuit 44 to perform multiplex sampling. The S/H circuit 44 holds a signal delivered from the adder 43 according to a pulse signal $\Phi_{S/T}$. When the output of the S/H circuit 44 is fed to the adder 43, it is possible to obtain a correlation difference between an average signal of the results obtained by a plurality of sampling operations and an initial level on which the same process was performed. By obtaining the correlation difference, it is possible to reduce freeze noise (particularly, thermal noise). By the sampling operations, the ADC 45 converts the analog signal held in the S/H circuit 44 to a digital signal. The register 46 holds the digital signal converted by the ADC 45. The digital signal held by the register 46 is read outside via a switch 42 on the output side of the register 46 to thereby cancel noise.

Figure 7:
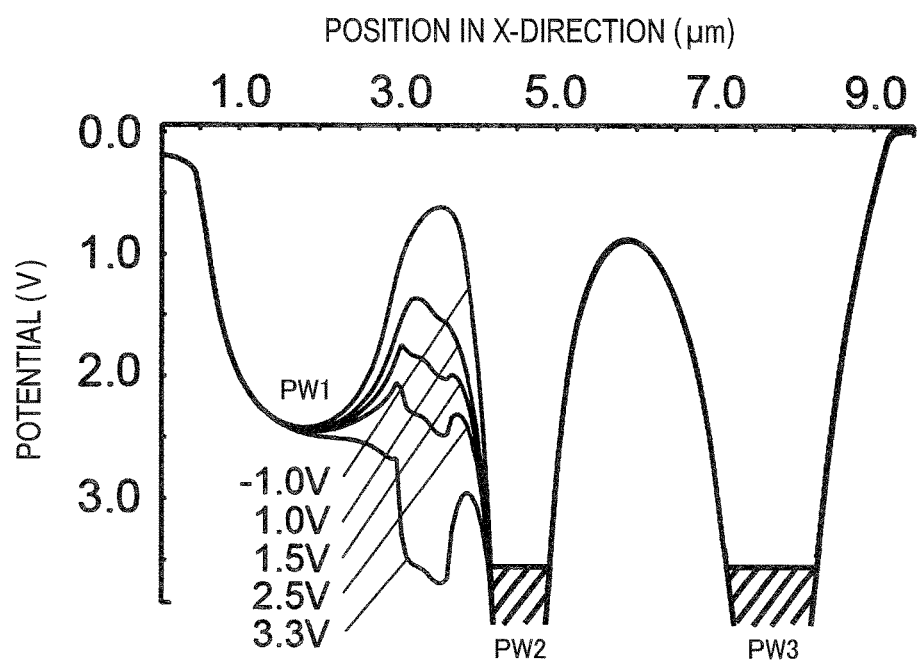
FIG. 7 is a potential diagram when a voltage to be applied to a transfer-gate electrode of the semiconductor element according to the first embodiment is changed.

FIG. 7 is a potential diagram at a cross-section (the X-direction) of the cross-sectional view of FIG. 3 when the buried charge-generation region 16, the charge-readout region 15, and the reset-performing region 12 are taken along a horizontal plane, in which a downward direction indicates a positive direction of potential. A potential valley PW1 indicating the position of a conduction band edge of the buried charge-generation region 16 is illustrated on the left side of the center of FIG. 3. Furthermore, a potential well PW2 of the charge-readout region 15 is illustrated on the right side of the potential valley PW1 with a transfer-potential barrier interposed between the potential well PW2 and the potential valley PW1. A state in which the potential well PW2 is filled with electrons at the Fermi level or lower is indicated by hatched top-right diagonal lines. Furthermore, a potential well PW3 of the reset-performing region 12 is illustrated on the right side of the potential well PW2 with a reset potential barrier interposed between the potential well PW3 and the potential well PW2. A state in which the potential well PW3 is filled with electrons at the Fermi level or lower is indicated by hatched top-right diagonal lines. Since the depths of the bottoms of the potential well PW2 of the charge-readout region 15 and the potential well PW3 of the reset-performing region 12 are at the Fermi level, the level of the top of a region indicated by the hatched top-right diagonal lines defines the depth of the bottom of the potential well.

Since the height of a transfer-potential barrier between the potential valley PW1 and the potential well PW2 is determined by a potential profile of the conduction band edge of the semiconductor region 11 immediately below the transfer-gate electrode 18, the height can be controlled by the voltage of the transfer-gate electrode 18. The height of the reset potential barrier between the potential well PW2 and the potential well PW3 is determined by changing the potential profile of the conduction band edge of the semiconductor region 11 sandwiched between the charge-readout region 15 and the reset-performing region 12 by changing the voltage applied to the reset-performing region 12.

As illustrated in FIG. 7, when the voltage applied to the transfer-gate electrode 18 is increased from −1.0 V to 1.0 V, 1.5 V, 25 volts, and 3.3 volts, the height of the transfer-potential barrier between the potential valley PW1 and the potential well PW2 decreases. That is, the transfer-gate electrode 18 electrostatically controls the potential of a transfer channel via the gate insulating film 19. For example, when a low voltage (zero volt or a negative voltage) is applied to the transfer-gate electrode 18 as the control signal TX, a transfer-potential barrier for electrons is formed between the buried charge-generation region 16 and the charge-readout region 15 and charges are not transferred from the buried charge-generation region 16 to the charge-readout region 15. On the other hand, when a high voltage (a positive voltage) is applied to the transfer-gate electrode 18 as the control signal TX, the height of the transfer-potential barrier between the buried charge-generation region 16 and the charge-readout region 15 decreases or disappears and charges are transferred from the buried charge-generation region 16 to the charge-readout region 15.

Figure 8:
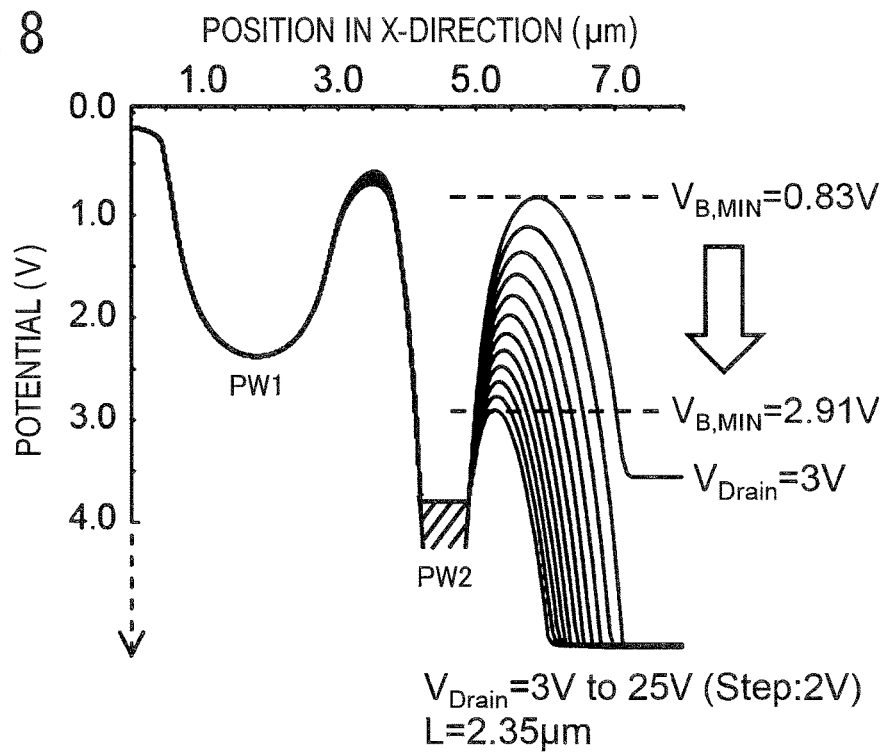
FIG. 8 is a potential diagram when a voltage to be applied to a reset-performing region of the semiconductor element according to the first embodiment is changed.

FIG. 8 illustrates a potential diagram that focuses on the reset potential barrier illustrated in FIG. 7. A peak potential $V_{B\_MIN}$ which is the height of a reset potential barrier between the charge-readout region 15 and the reset-performing region 12 when the distance L between the charge-readout region 15 and the reset-performing region 12 was set to 2.35 micrometers and the voltage $V_{Drain}$ as the reset signal RT was increased gradually from 3 volts to 25 volts with a step of 2 volts was calculated by simulation. The peak potential $V_{B\_MIN}$ of the reset potential barrier was 0.83 volt when the voltage $V_{Drain}$ as the reset signal RT was 3 volts. The absolute value of the peak potential $V_{B\_MIN}$ increased (the height of the reset potential barrier decreased) as the voltage $V_{Drain}$ as the reset signal RT was increased. When the voltage $V_{Drain}$ as the reset signal RT was 25 volts, the peak potential $V_{B\_MIN}$ was 2.91 volts, and the height of the reset potential barrier was lower than the transfer-potential barrier of approximately 3 volts determined by the power supply voltage of 3.3 volts, charges required for reset can be exhausted from the charge-readout region 15 to the reset-performing region 12.

Figure 9:
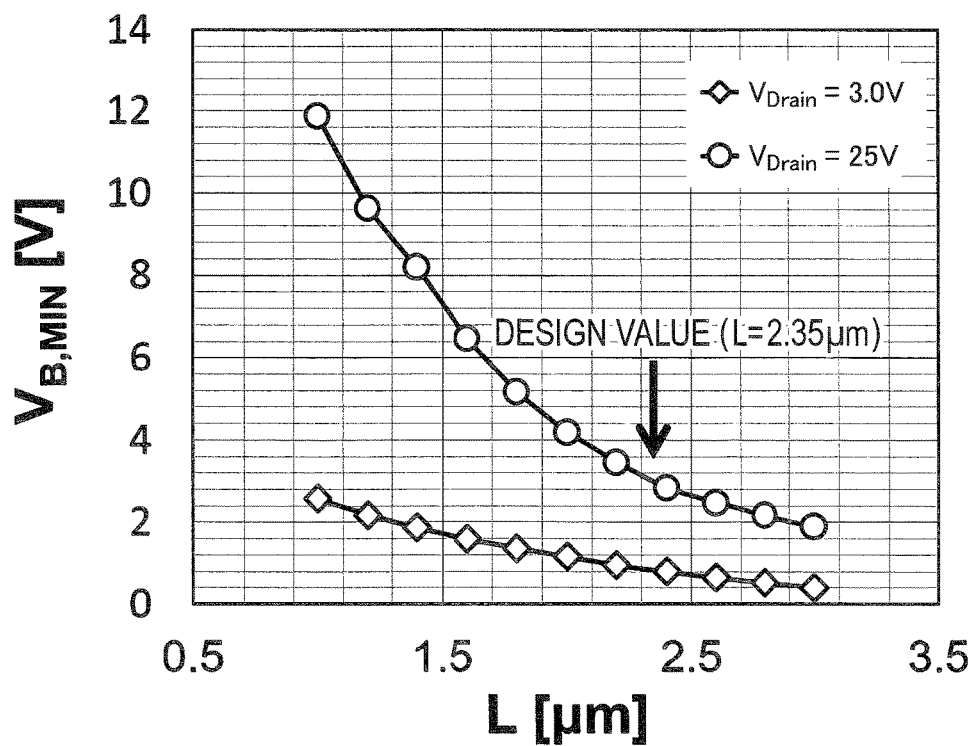
FIG. 9 is a graph illustrating a relationship between a height of a reset potential barrier and a distance between a reset-performing region and an end of a charge-readout region of the semiconductor element according to the first embodiment.

FIG. 9 illustrates a simulation result of the peak potential $V_{B\_MIN}$ of the reset potential barrier when the voltage $V_{Drain}$ as the reset signal RT was 3 and 25 volts and the distance L between the charge-readout region 15 and the reset-performing region 12 was changed. It can be understood from FIG. 9 that when the distance L increases, the peak potential $V_{B\_MIN}$ of the reset potential barrier decreases regardless of whether the voltage $V_{Drain}$ as the reset signal RT was 3 or 25 volts. If the distance L increases when the voltage $V_{Drain}$ as the reset signal RT was 25 volts in FIG. 9, the peak potential $V_{B\_MIN}$ of the reset potential barrier changes steeply. Due to the simulation illustrated in FIG. 9, it can be understood that if the distance L increases, when the voltage $V_{Drain}$ as the reset signal RT was changed between 3 and 25 volts, a change in the height of the reset potential barrier decreases.

Figure 10:
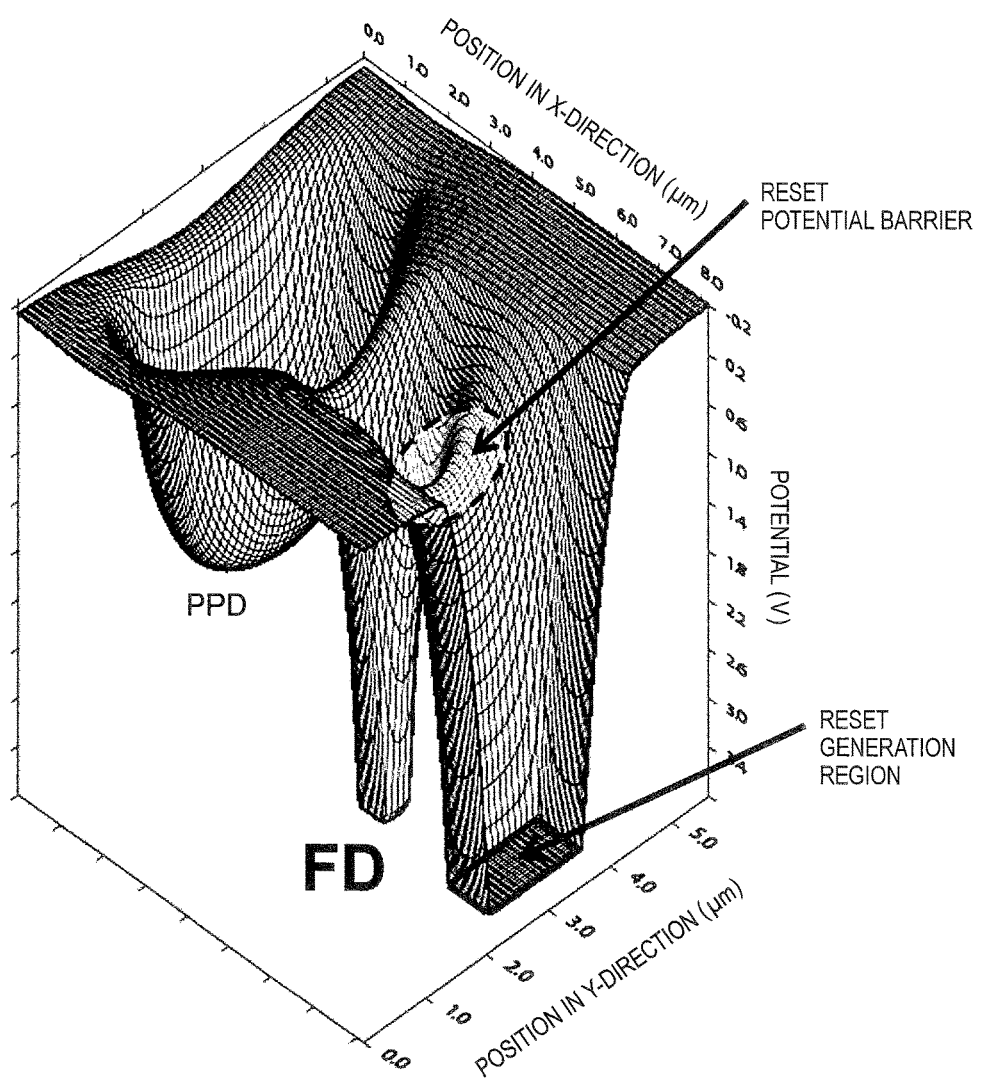
FIG. 10 is a potential diagram based on three-dimensional simulation when a voltage of 3 volts was applied to a reset-performing region of the semiconductor element according to the first embodiment.
Figure 11:
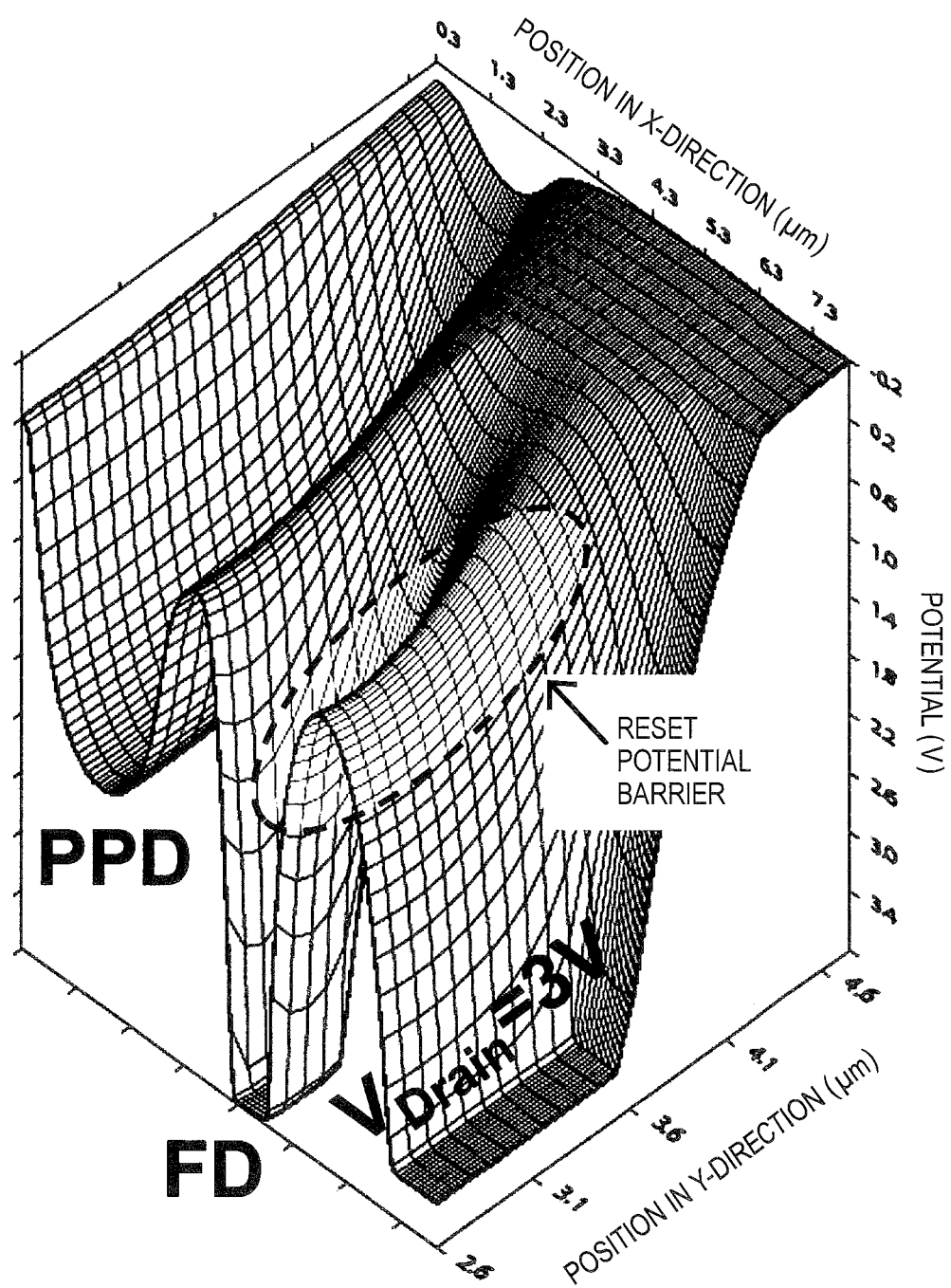
FIG. 11 is a potential diagram based on three-dimensional simulation which focuses on a reset potential barrier when a voltage of 3 volts was applied to a reset-performing region of the semiconductor element according to the first embodiment.
Figure 12:
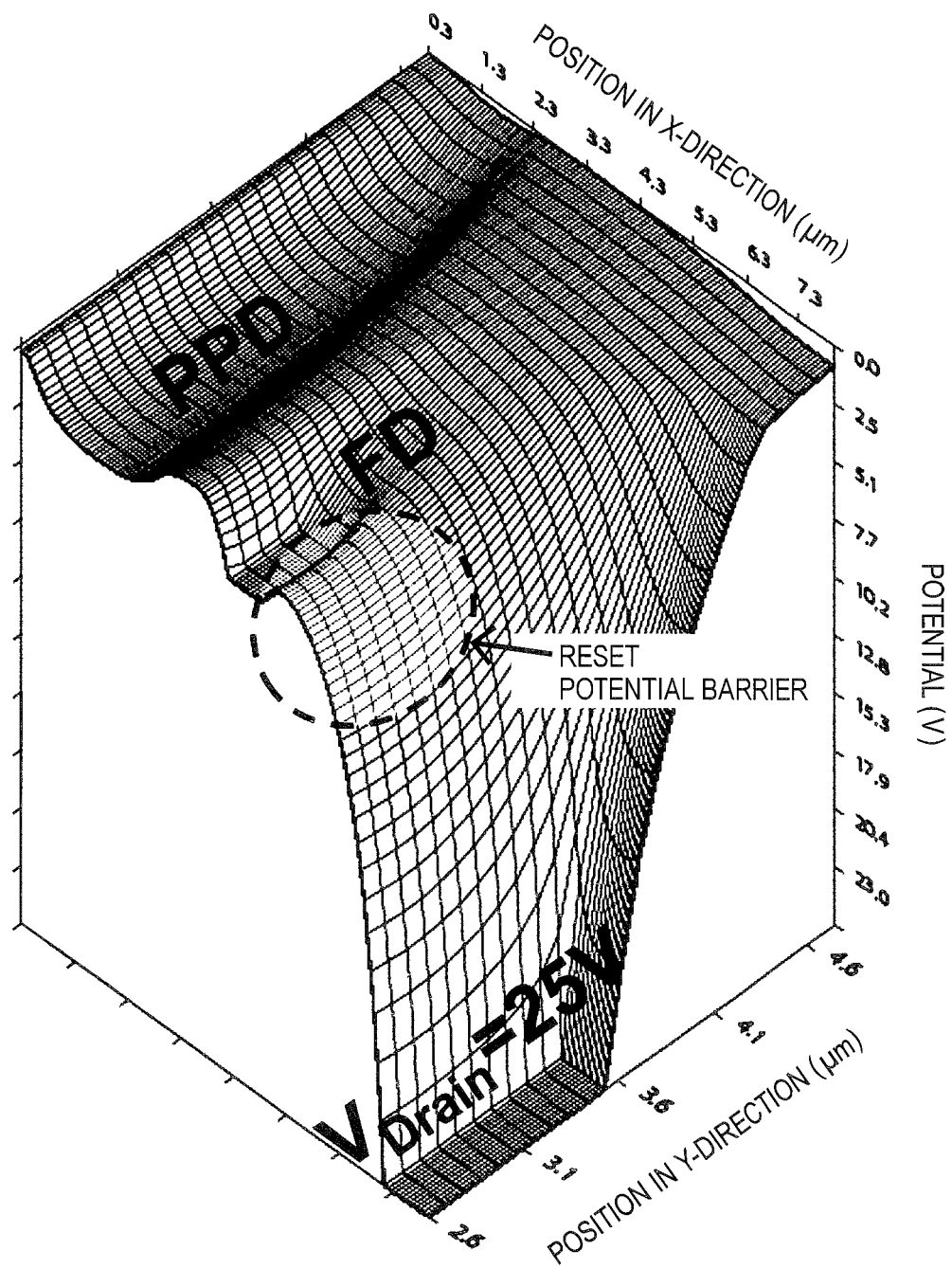
FIG. 12 is a potential diagram based on three-dimensional simulation which focuses on a reset potential barrier when a voltage of 25 volts was applied to a reset-performing region of the semiconductor element according to the first embodiment.

FIG. 10 illustrates a potential diagram obtained by three-dimensional simulation corresponding to the semiconductor element according to the first embodiment, in which a downward direction indicates a positive direction of potential. The simulation condition was set such that the impurity concentration of the buried charge-generation region 16 was $6.75 \times 10^{16}$ cm$^{-3}$, the impurity concentration of the pinning layer 17 was $2.24 \times 10^{17}$ cm$^{-3}$, the impurity concentration of the semiconductor region 11 was $5.0 \times 10^{13}$ cm$^{-3}$, and the voltage $V_{Drain}$ as the reset signal RT was 3 volts. FIGS. 11 and 12 are enlarged three-dimensional potential diagrams which focus on the reset-performing region 12. As illustrated in FIG. 11, when a low voltage $V_{Drain}$ of 3 volts was applied as the reset signal RT, the height of the reset potential barrier between the charge-readout region 15 and the reset-performing region 12 was approximately 1 volt. On the other hand, as illustrated in FIG. 12, when a high voltage $V_{Drain}$ of 25 volts was applied as the reset signal RT, the height of the reset potential barrier between the charge-readout region 15 and the reset-performing region 12 was reduced to approximately 3 volts. In this way, the charges in the charge-readout region 15 can be exhausted via the reset-performing region 12, and the charge-readout region 15 can be reset to the level of a predetermined residual charge amount.

Figure 13:
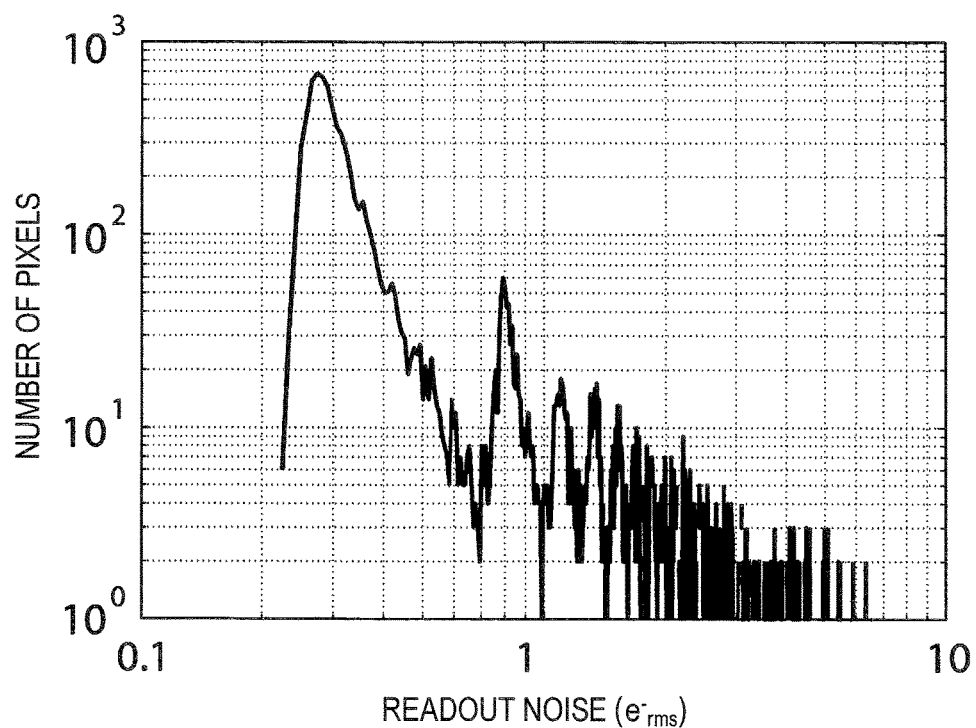
FIG. 13 is a graph illustrating a measurement result of a readout noise histogram of the solid-state imaging device according to the first embodiment.
Figure 14:
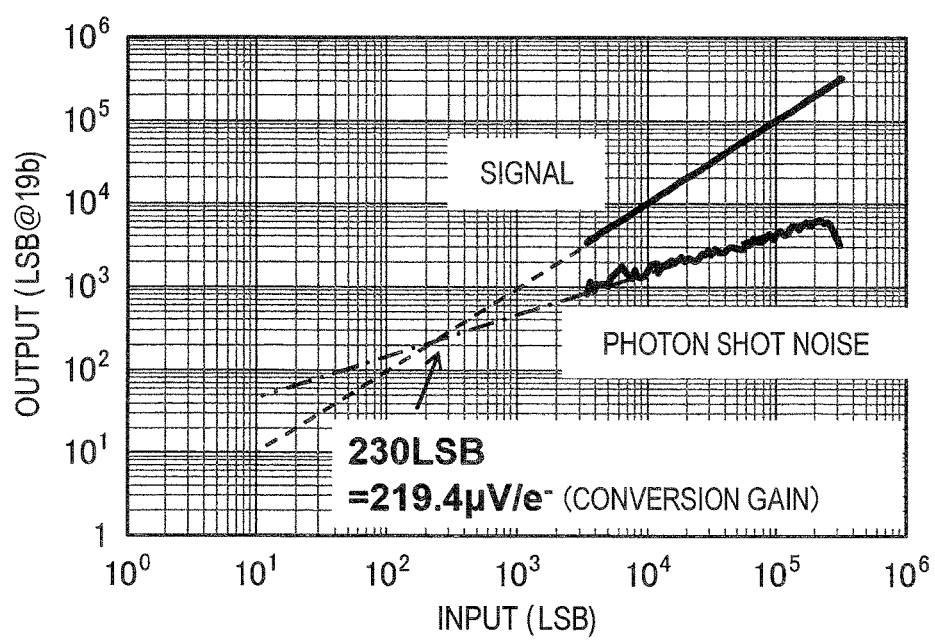
FIG. 14 is a graph illustrating an input-output relationship of the solid-state imaging device according to the first embodiment.

FIG. 13 illustrates a measurement result of a readout noise histogram. 15810 pixels (15810=510 (vertical)×31 (horizontal)) were captured in 100 frames and an integration period was set to 149 msec. It was ascertained from the measured readout noise histogram that the peak value of the readout noise had a noise level as low as 0.27 e$^-_{rms}$. A conversion gain for converting a voltage to electrons was 219.4 µV/e$^-$. The conversion gain value was calculated from calculation results of photo shot noise and signal input and output as illustrated in FIG. 14.

Figure 15A:
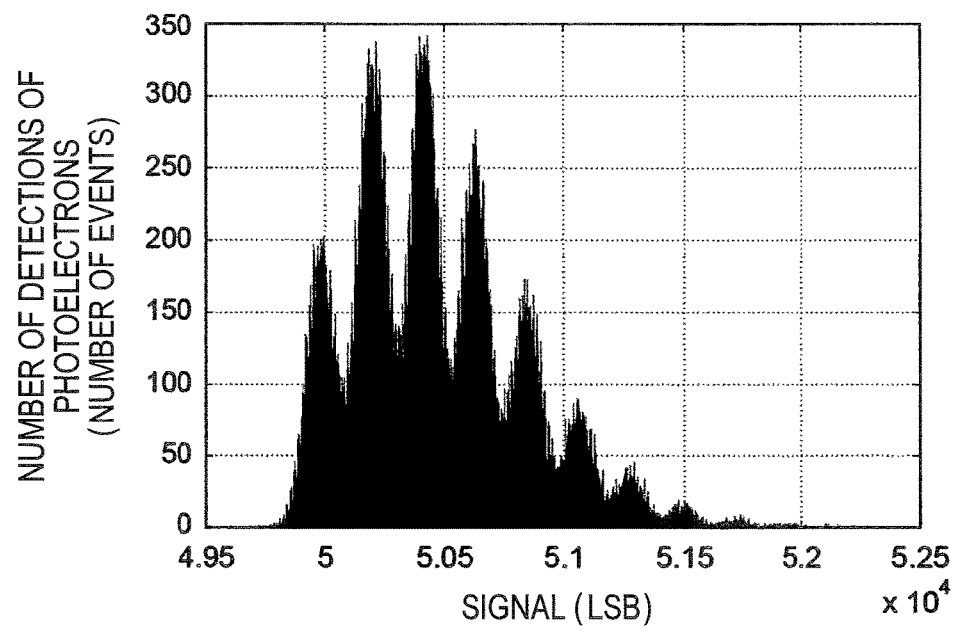
FIG. 15A is a graph illustrating a measurement result of a photon counting histogram (PCH) of the solid-state imaging device according to the first embodiment and FIG. 15B is a graph illustrating a theoretical curve of a Poisson distribution corresponding to FIG. 15A.
Figure 15B:
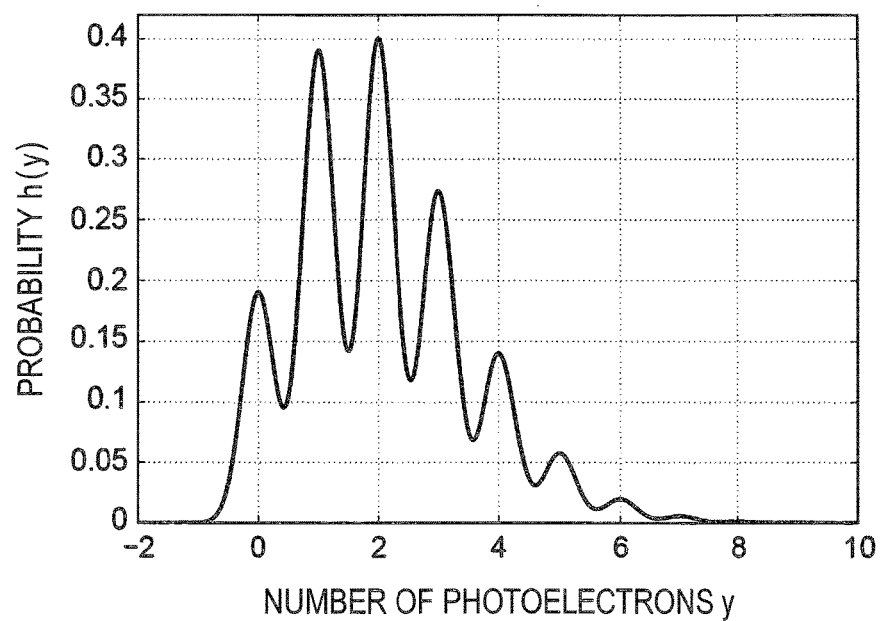
Figure 16A:
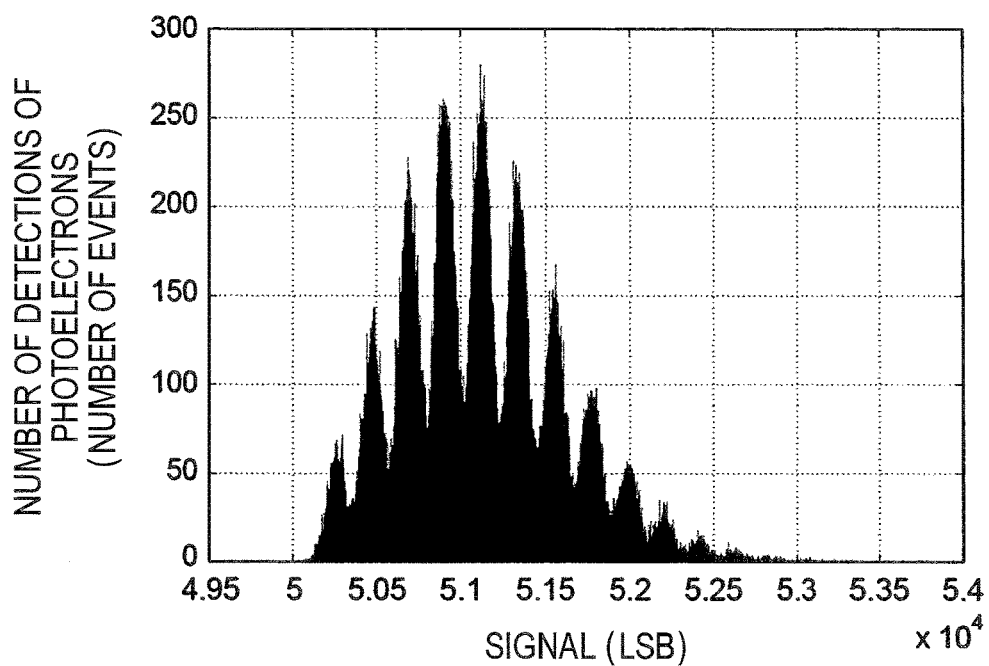
FIG. 16A is a graph illustrating a measurement result of PCH of the solid-state imaging device according to the first embodiment and FIG. 16B is a graph illustrating a theoretical curve of a Poisson distribution corresponding to FIG. 16A.
Figure 16B:
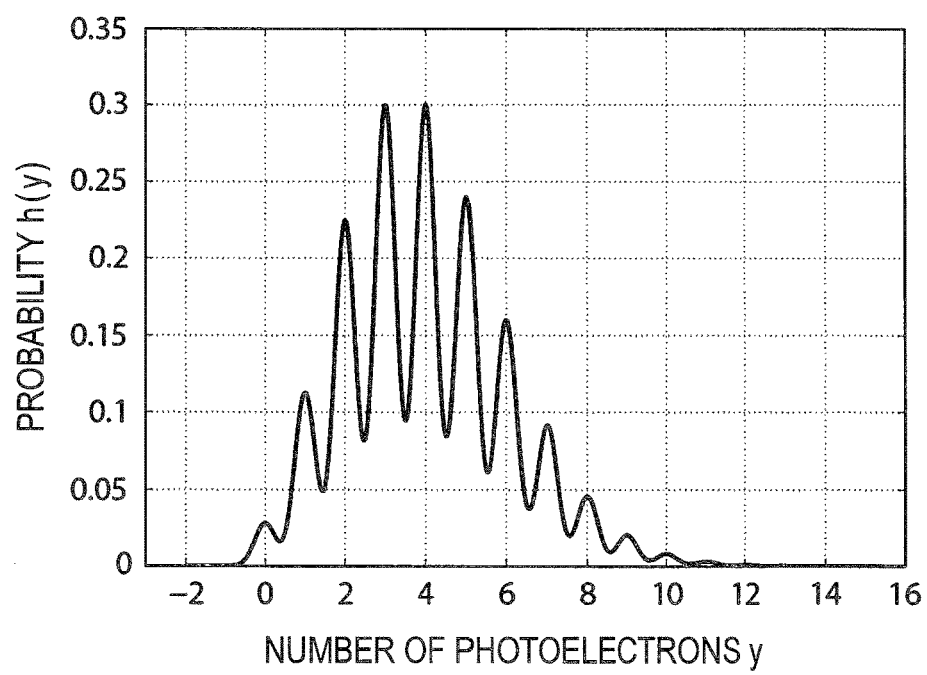

FIGS. 15A and 15B illustrate a measurement result of a photon counting histogram (PCH) and a theoretical curve of the corresponding Poisson distribution when the number of effective photoelectrons λ serving as parameters of the Poisson distribution is 2.05. FIGS. 16A and 16B illustrate a measurement result of PCH and a theoretical curve of the corresponding Poisson distribution when the number of effective photoelectrons λ is 4.0. The parameter λ is an expected number of events occurring in a predetermined segment and is an effective number of photons determined by calculation and corresponds to an average value.

In FIG. 15A, the conversion gain was 219.4 µV/e⁻ and was 230 LSB/e⁻ when an internal ADC was used, noise was 0.27 e⁻$_{rms}$, and the number (the number of events) of times when photoelectrons were detected among 100,000 measurements was measured. On the other hand, in FIG. 16A, the conversion gain was 219.4 µV/e⁻ and was 230 LSB/e⁻ when an internal ADC was used similarly to FIG. 15A. However, noise was 0.26 e⁻$_{rms}$ unlike FIG. 15A. In FIG. 16A, the number of times when photoelectrons were detected among 100,000 measurements was measured. The abscissa axis in FIGS. 15B and 16B indicates the number of photoelectrons (y).

As illustrated in FIGS. 15A and 16A, the PCH measurement result is approximately identical to the theoretical curve of the Poisson distribution having the spread of the Gauss distribution due to noise illustrated in FIGS. 15B and 16B. In FIGS. 15A to 16B, although the peaks spread due to the presence of noise, a delta function is obtained unless noise is present.

A probability h(y) that photoelectrons are detected y times in a predetermined segment is obtained by the following Eq. (1).

$$h(y) = \Sigma(\lambda^x/x!)e^{-\lambda}(1/((2\pi)^{1/2}\sigma))\exp(-(y-x)^2/(2\sigma^2))) \quad (1)$$

Here, Σ means the summation of the sequence of consecutive integers x from 1 to infinite, x is the number of photoelectrons corresponding to each event and is a discrete value serving as an average value of the Gauss distribution, y is a continuous value corresponding to the number of detected photoelectrons, and e=2.71828 is the Napier's constant. σ is a standard deviation indicating a readout noise level and σ=0.26 e⁻$_{rms}$ in FIG. 15B and σ=0.27 e⁻$_{rms}$ in FIG. 16B.

Figure 17A:
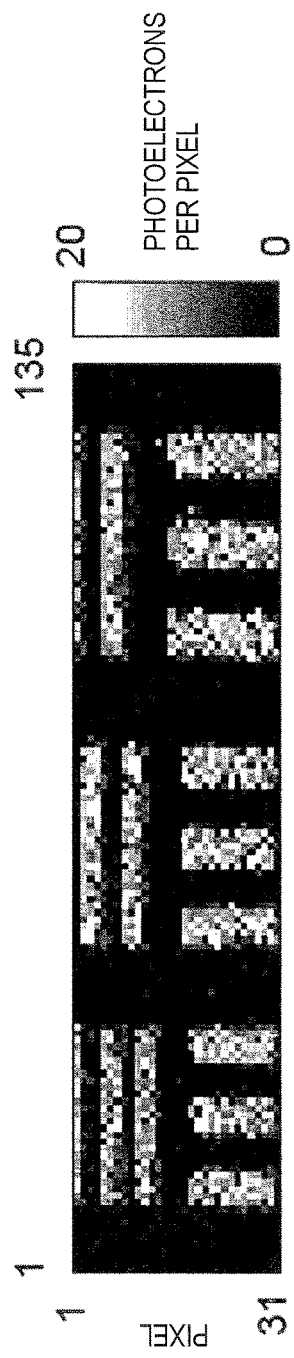
FIG. 17A is an image of a signal range of 0 to 20 electrons captured by the solid-state imaging device according to the first embodiment using a US Air force (USAF) test chart.
Figure 17B:
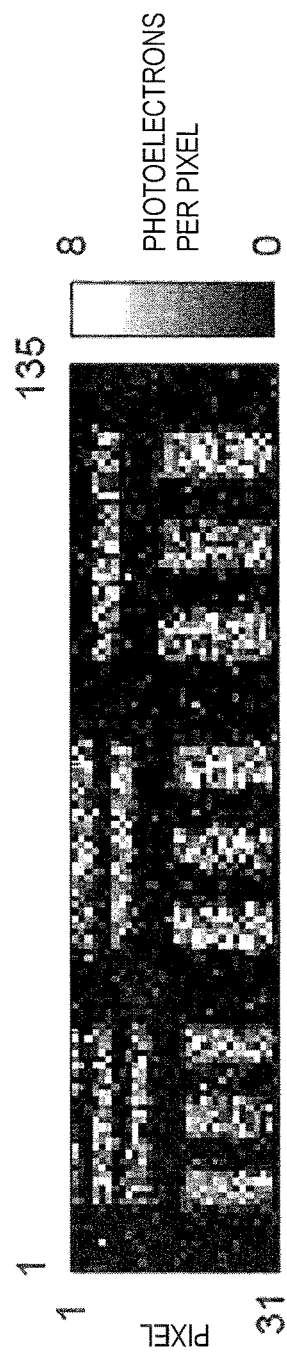
FIG. 17B is an image of a signal range of zero to eight electrons captured by the solid-state imaging device according to the first embodiment using the USAF resolution test chart.
Figure 17C:
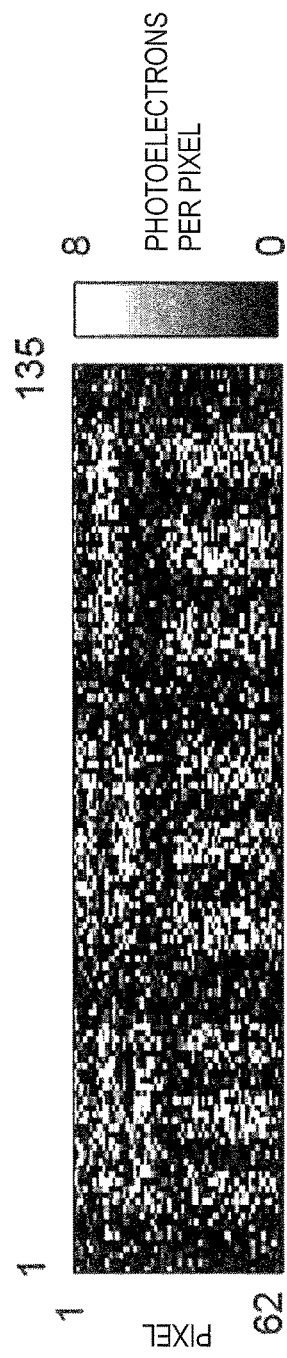
FIG. 17C is an image of a signal range of zero to eight electrons captured by an earlier low-noise solid-state imaging device using the USAF resolution test chart.

In order to evaluate a photoelectron measurement capability, photoelectrons were captured by the solid-state imaging device according to the first embodiment and the earlier low-noise solid-state imaging device using the US Air force (USAF) resolution test chart. A readout noise level of the earlier low-noise CMOS image sensor was 0.45 e⁻$_{rms}$ and a pixel conversion gain was 135 µV/e⁻. A sensor chip was air-cooled up to −10 degree centigrade in order to minimize the influence of a dark current and a region of 35 (horizontal)×512 (vertical) pixels was measured. FIGS. 17A to 17C illustrate images in which photoelectrons are captured. Signals (photoelectrons) per pixel for 142 milliseconds were calculated from PCH of each pixel.

FIG. 17A illustrates a signal range of zero to 20 electrons captured by the solid-state imaging device according to the first embodiment, FIG. 17B illustrates a signal range of zero to eight electrons captured by the solid-state imaging device according to the first embodiment, and FIG. 17C illustrates a signal range of zero to eight electrons captured by an earlier low-noise solid-state imaging device. The captured images in FIGS. 17A to 17C have different signal ranges adjusted by a fixed light intensity and an ND filter. It can be understood that the captured images of the solid-state imaging device according to the first embodiment in FIGS. 17A and 17B have emphasized contrast as compared to the captured image of the earlier low-noise CMOS image sensor in FIG. 17C.

A prototype of the solid-state imaging device according to the first embodiment was manufactured. The number of effective pixels was set to 35 (horizontal)×512 (vertical) among an entire pixel array of 312 (horizontal)×512 (vertical), a pixel size was set to 11.2 micrometers×5.6 micrometers, and a full well capacity (FWC) was set to approximately 1500 electrons. The measurement result of the conversion gain and the readout noise of the experimental solid-state imaging device shows that a high conversion gain of approximately 220 µV/e⁻ and a low readout noise level of 0.27 e⁻$_{rms}$ were achieved.

<Operation of Solid-State Imaging Device>

Figure 18:
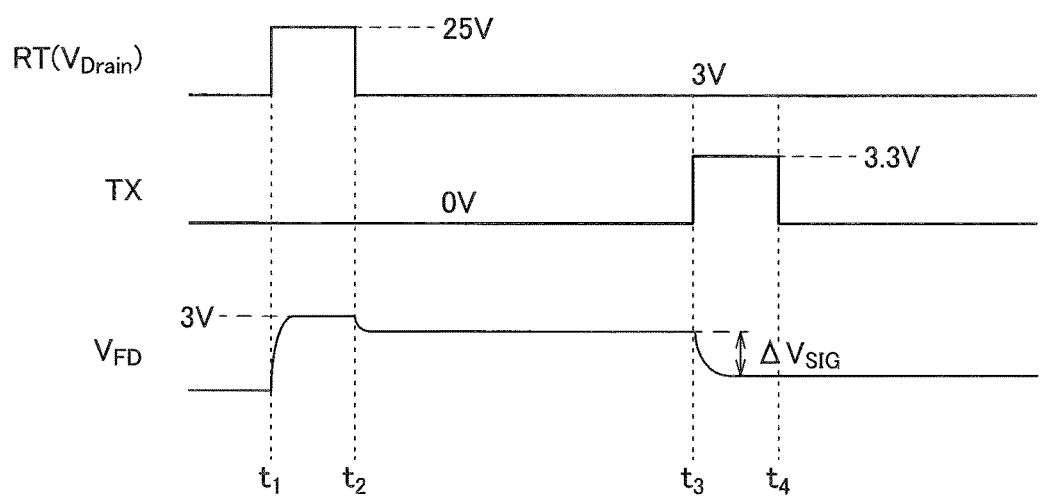
FIG. 18 is a timing chart illustrating, for one frame, a readout method of the solid-state imaging device according to the first embodiment.

Next, an example of the operation of a solid-state imaging device according to the first embodiment will be described with reference to the timing chart of FIG. 18.

(a) In time points t1 to t2, the control signal TX applied to the transfer-gate electrode 18 is maintained to a low (L) level (zero volt), a rectangular reset signal RT is applied to the reset-performing region 12, and a reset operation of the charge-readout region 15 is performed. That is, at time point t1, the reset signal RT starts changing from the low (L) level (3 volts) to the high (H) level (25 volts), the height of the reset potential barrier between the reset-performing region 12 and the charge-readout region 15 illustrated in FIG. 8 decreases, and charges are exhausted from the charge-readout region 15. In time points t1 to t2, the potential V$_{FD}$ of the charge-readout region 15 reaches 3 volts as illustrated in FIGS. 8 and 12. After that, when the reset signal RT changes from the high (H) level (25 volts) to the low (L) level (3 volts) at time point t2, the potential V$_{FD}$ of the charge-readout region 15 decreases slightly lower than 3 volts.

(b) In time points t2 to t3, the reset signal RT applied to the reset-performing region 12 and the control signal TX applied to the transfer-gate electrode 18 are maintained to the low (L) level, and as illustrated in FIG. 3, and light is incident on the photodiodes D₁ of the respective pixels X$_{ij}$ through openings of the light-shielding films 20 of the respective pixels X$_{ij}$. The photodiode D₁ receives the light incident through the openings of the light-shielding film 20 as a light signal and converts the light signal to charges.

(c) At time point t3, when the control signal TX applied to the transfer-gate electrode 18 reaches the high (H) level (3.3 volts), the height of the transfer-potential barrier between the potential valley PW1 and the potential well PW2 illustrated in FIG. 7 decreases, and charges are transferred from the buried charge-generation region 16 to the charge-readout region 15 in time points t3 to t4. The potential V$_{FD}$ of the charge-readout region 15 decreases by ΔV$_{SIG}$ so as to correspond to the amount of charges transferred from the buried charge-generation region 16 to the charge-readout region 15.

Figure 19:
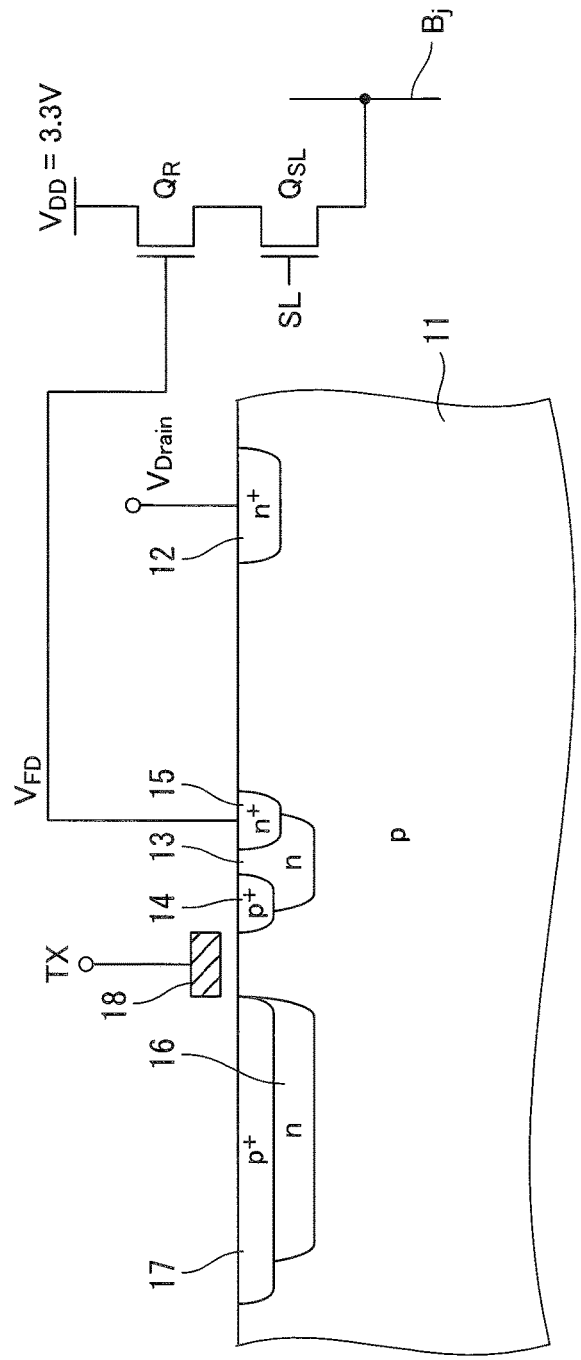
FIG. 19 is a schematic cross-sectional view including a structure of a signal-readout circuit of the semiconductor element according to the first embodiment.

(d) At timings later than time point t4, when the pixel-selecting switching-transistor Q$_{SL}$ is turned on, a current depending on the gate potential of the readout-transistor (the amplification-transistor) Q$_R$ that forms the signal-readout circuit illustrated in FIG. 19 is read out via the vertical signal line B$_j$.

According to the solid-state imaging device according to the first embodiment, when a positive voltage is applied to the reset-performing region 12 and the reset potential barrier between the reset-performing region 12 and the charge-readout region 15 is varied using an electrostatically induced electric field from the reset-performing region 12, the charges in the charge-readout region 15 can be exhausted to the reset-performing region 12 and a reset operation can be performed. Therefore, a reset transistor having a reset-gate electrode of the earlier pixel is unnecessary. Because the reset transistor is unnecessary. it is possible to remove a parasitic capacitance between the reset-gate electrode and the charge-readout region of the earlier pixel. Therefore, it is possible to reduce a floating diffusion capacitance. As a result, it is possible to obtain a high pixel conversion gain, reduce noise inside pixels, and reduce a temporal fluctuation. Moreover, since a high conversion gain and an ultralow noise of the photon counting level can be achieved using the standard CMOS technology without using a finer manufacturing-process technology, high efficiency and high technical feasibility is obtained as compared to the earlier technology.

[First Modification of First Embodiment]

Figure 20A:
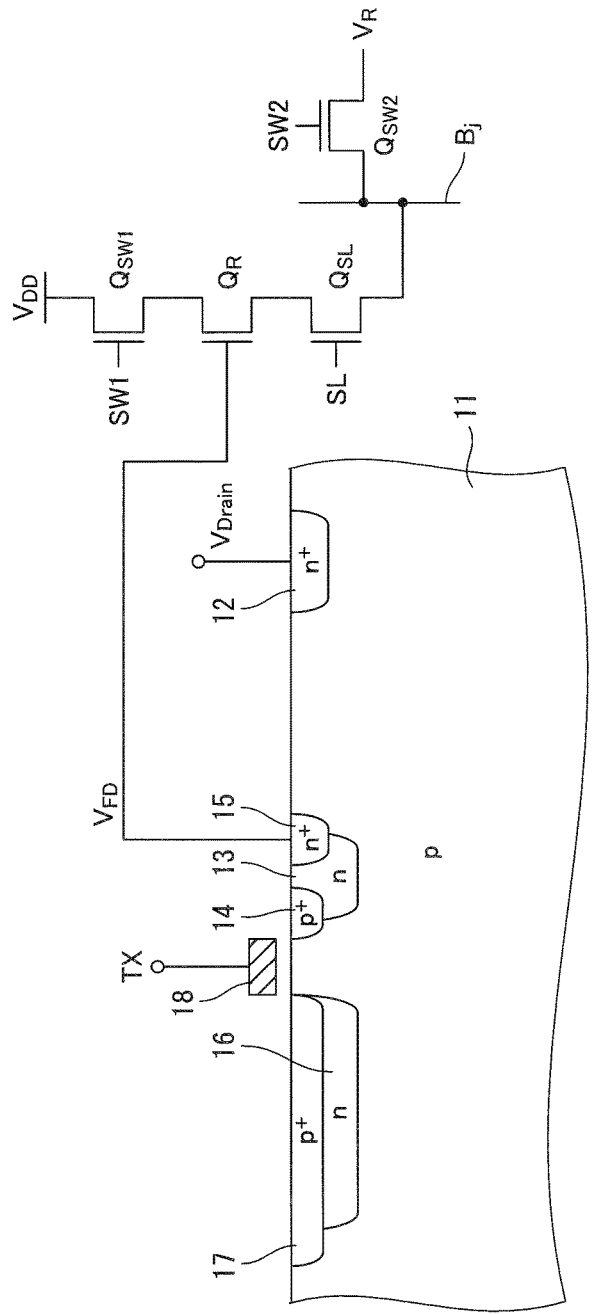
FIG. 20A is a schematic cross-sectional view illustrating a structure of a semiconductor element according to a first modification of the first embodiment and FIG. 20B is a potential diagram of the semiconductor element according to the first modification of the first embodiment.
Figure 20B:
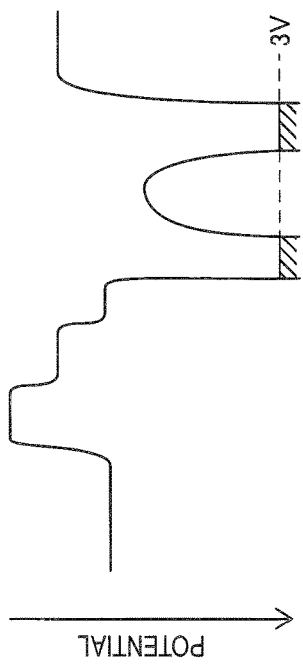

FIG. 20A illustrates the structure of a semiconductor element according to a first modification of the first embodiment and FIG. 20B illustrates a potential diagram corresponding to FIG. 20A in which a downward direction indicates a positive direction of potential. As illustrated in FIG. 20A, the semiconductor element according to the first modification of the first embodiment is different from the structure of the signal-readout circuit of the semiconductor element according to the first embodiment illustrated in FIG. 4 in that the switching-transistor $Q_{SW1}$ is connected to the source side of the readout-transistor $Q_R$ of the signal-readout circuit connected to the charge-readout region 15 and the drain side of the switching-transistor $Q_{SW2}$ is connected to the vertical signal line $B_j$.

In the first modification of the first embodiment, charges accumulated in the charge-readout region 15 are exhausted by changing the variable voltage applied to the reset-performing region 12 and the states of the vertical signal line $B_j$, the switching-transistor $Q_{SW1}$, the readout-transistor $Q_R$, and the switching-transistor $Q_{SW2}$. In this case, the potential of the charge-readout region 15 is changed using a gate capacitance of the readout-transistor $Q_R$ as a bootstrap capacitance and the charges accumulated in the charge-readout region 15 are exhausted.

Figure 21A:
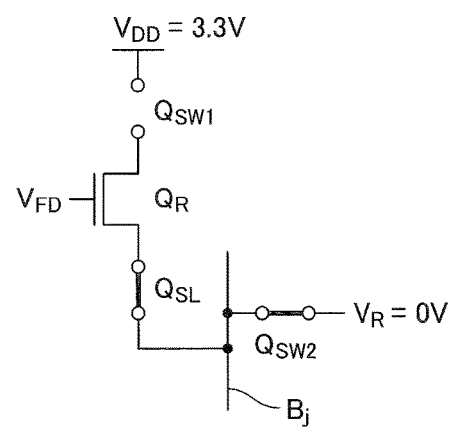
FIG. 21A is a schematic circuit diagram of a signal-readout circuit for describing a readout method of the semiconductor element according to the first modification of the first embodiment and FIG. 21B is a potential diagram in a state corresponding to FIG. 21A, of the semiconductor element according to the first modification of the first embodiment.
Figure 21B:
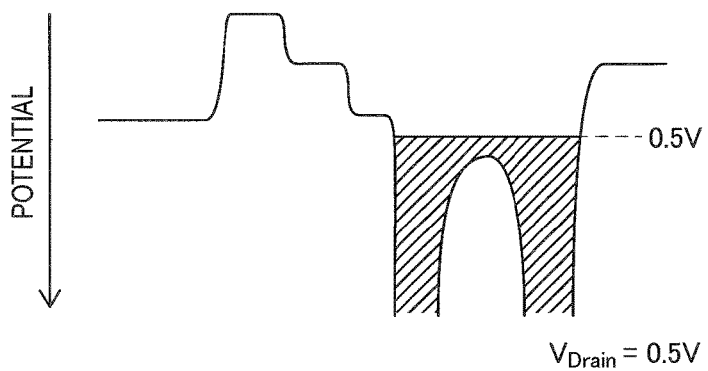

As an operation of exhausting charges accumulated in the charge-readout region 15, first, the voltage $V_{Drain}$ (=0.5 volt) as the reset signal RT applied to the reset-performing region 12 will be considered as illustrated in FIG. 21A. When the switching-transistor $Q_{SW1}$ is turned off, the switching-transistor $Q_{SW2}$ is turned on, and the select-transistor $Q_{SL}$ is turned on, as illustrated in FIG. 21B, a predetermined voltage $V_R$ of zero volt is applied to the source region of the readout-transistor $Q_R$, and the source region of the readout-transistor $Q_R$ is set to a ground potential. A voltage $V_{Drain}$ of 0.5 volt is applied to the reset-performing region 12 as a variable voltage. In this way, the reset-performing region 12 is set to a constant potential lower than the potential of the charge-readout region 15, charges are supplied to the reset-performing region 12 over the reset potential barrier, and the potential of the charge-readout region 15 is set to the same potential as the potential $V_{Drain}$ of 0.5 volt applied to the reset-performing region 12. In this case, like the potential diagram illustrated in FIG. 21B, a state in which the potential well PW2 of the charge-readout region 15 and the potential well PW3 of the reset-performing region 12 are filled with electrons is created and the Fermi level reaches 0.5 volt.

Figure 22A:
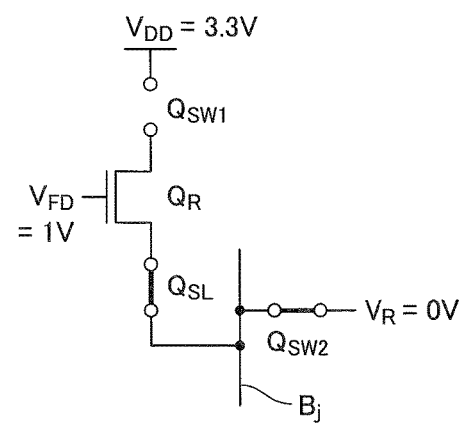
FIG. 22A is a schematic circuit diagram of a signal-readout circuit for describing a readout method of the semiconductor element according to the first modification of the first embodiment and FIG. 22B is a potential diagram in a state corresponding to FIG. 22A, of the semiconductor element according to the first modification of the first embodiment.
Figure 22B:
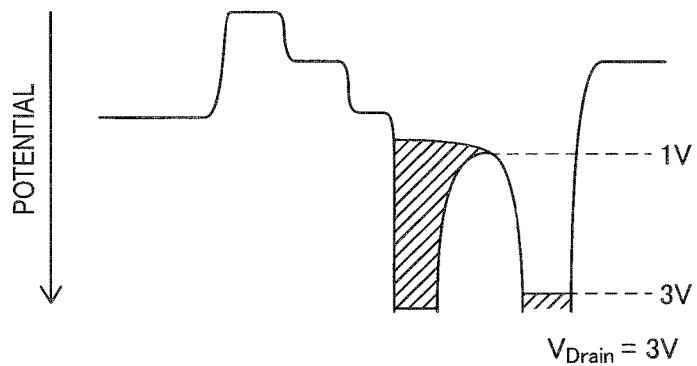

Subsequently, as illustrated in FIGS. 22A and 22B, in a state in which the switching-transistor $Q_{SW1}$ is turned off and the switching-transistor $Q_{SW2}$ is turned on, a voltage $V_{Drain}$ of 3 volts is applied to the reset-performing region 12 as a variable voltage corresponding to the reset signal. In this way, the reset-performing region 12 is set to a constant potential higher than the potential that the charge-readout region 15 has in a readout operation, the height of the reset potential barrier is changed, and the potential of the charge-readout region 15 is set to a potential $V_{FD}$ of 1 volt the same as the potential of the reset potential barrier. This readout voltage $V_{FD}$ of 1 volt is applied to the gate electrode of the readout-transistor $Q_R$. A potential difference between the reset potential barrier and the bottom potential of the potential well PW2 of the charge-readout region 15 is 2 volts.

Figure 23A:
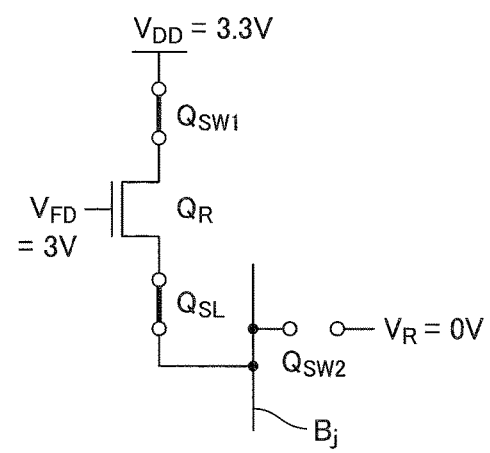
FIG. 23A is a schematic circuit diagram of a signal-readout circuit for describing a readout method of the semiconductor element according to the first modification of the first embodiment and FIG. 23B is a potential diagram in a state corresponding to FIG. 23A, of the semiconductor element according to the first modification of the first embodiment.
Figure 23B:
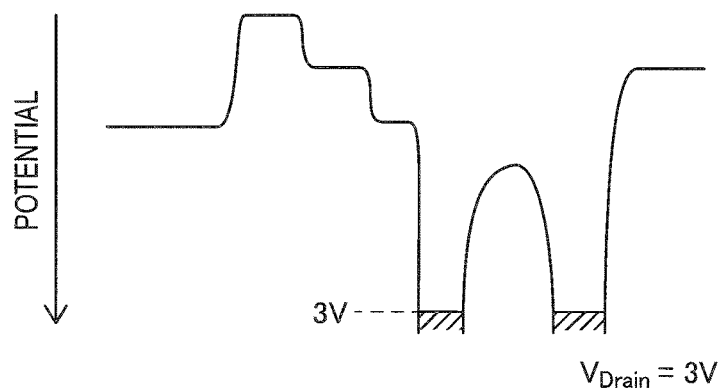

Subsequently, as illustrated in FIG. 23A, when the switching-transistor $Q_{SW2}$ is turned off and the switching-transistor $Q_{SW1}$ is turned on, a voltage $V_{DD}$ of 3.3 volts is applied to the drain region of the readout-transistor $Q_R$. The gate capacitance of the readout-transistor $Q_R$ at that time is used as a bootstrap capacitance, and the gate potential $V_{FD}$ of the readout-transistor $Q_R$ (that is, the potential of the charge-readout region 15) is the potential $V_{FD}$ (=3 volts) necessary for exhausting charges. In a state in which the potential difference between the reset potential barrier of the bottom potential of the potential well PW2 of the charge-readout region 15 illustrated in FIG. 22B is maintained to 2 volts, the bottom potential of the potential well PW2 of the charge-readout region 15 reaches 3 volts by the bootstrap effect illustrated in FIG. 23B, and the reset of the potential well PW2 of the charge-readout region 15 is completed.

Figure 24:
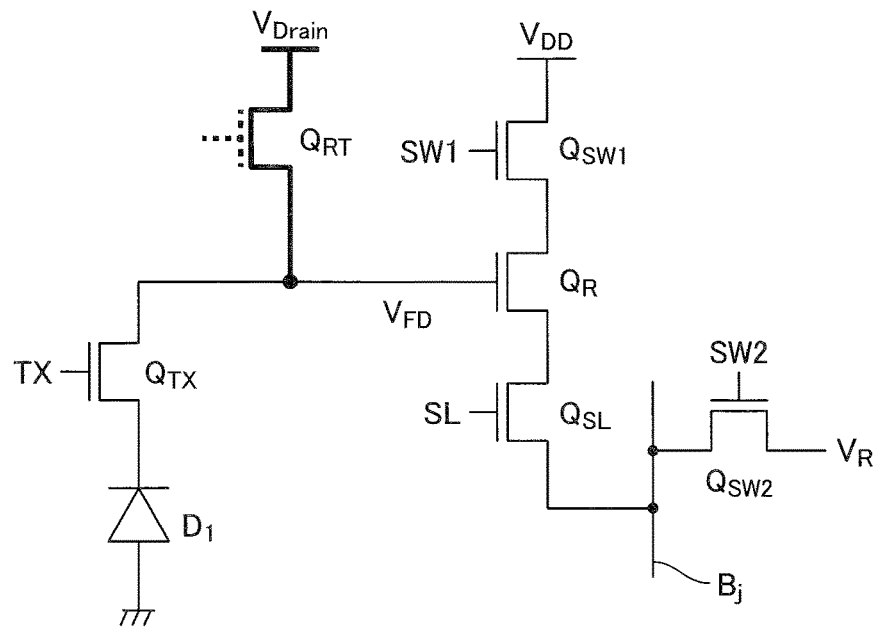
FIG. 24 is an equivalent circuit diagram of the semiconductor element according to the first modification of the first embodiment.

An equivalent circuit of the entire semiconductor element according to the first modification of the first embodiment can be represented as a circuit including the switching-transistor $Q_{SW1}$ connected between the power supply $V_{DD}$ and the readout-transistor $Q_R$ and the switching-transistor $Q_{SW2}$ connected between the vertical signal line $B_j$ and the control signal line having a predetermined voltage $V_R$ as illustrated in FIG. 24. The transfer transistor $Q_{TX}$ implemented by the charge transfer mechanism (18, 19) is connected to the photodiode $D_1$ built up by the semiconductor region 11 and the buried charge-generation region 16. The gate electrode of the readout-transistor $Q_R$ is connected to a charge-readout region indicated by one of the main electrodes of the transfer transistor $Q_{TX}$. The drain region of the readout-transistor $Q_R$ is connected to the switching-transistor $Q_{SW1}$, and the source region of the readout-transistor $Q_R$ is connected to the drain region of the pixel-selecting switching-transistor $Q_{SL}$. The source region of the switching-transistor $Q_{SL}$ is connected to the vertical signal line FIG. 24 schematically illustrates the function of the reset-performing region 12 illustrated in FIG. 20, and the reset mechanism $Q_{RT}$ is represented by a electronic symbol similar to a transistor which illustrates a gate electrode by a broken line to thereby modeling that reset can be performed without using a reset electrode having a gate electrode.

[Second Modification of First Embodiment]

Figure 25:
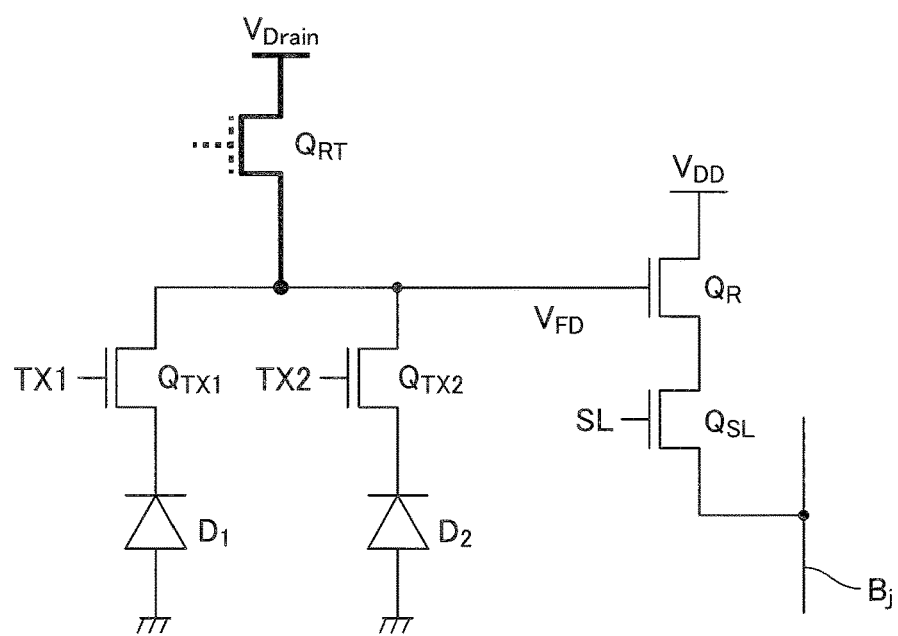
FIG. 25 is a schematic circuit diagram of the semiconductor element according to a second modification of the first embodiment.

Another modification of a structure of the semiconductor element according to the first embodiment will be described as a second modification of the first embodiment. As illustrated in FIG. 25, the semiconductor element may include a plurality of (two) photodiodes $D_1$ and $D_2$ and a plurality of (two) transfer transistors $Q_{TX1}$ and $Q_{TX2}$ connected to the plurality of (two) photodiodes $D_1$ and $D_2$. Since one charge-readout region 15 is provided with respect to the plurality of (two) photodiodes $D_1$ and $D_2$, the size of the respective pixels $X_{ij}$ can be reduced and a high spatial resolution can be realized. The number of combinations of the photodiodes $D_1$ and $D_2$ and the transfer transistors $Q_{TX1}$ and $Q_{TX2}$ may be three or more.

Figure 26:
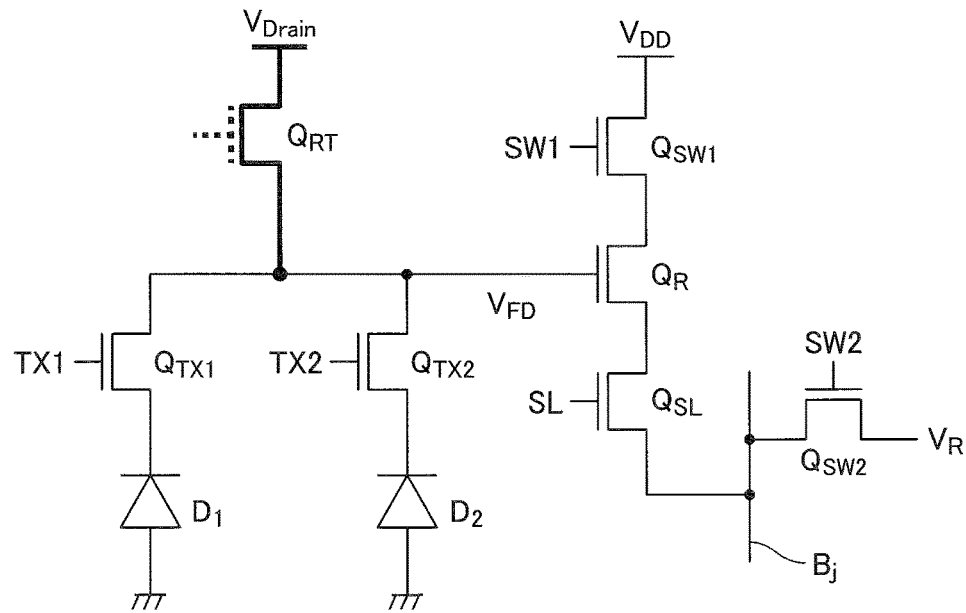
FIG. 26 is a schematic circuit diagram of the semiconductor element according to the second modification of the first embodiment.
Figure 27:
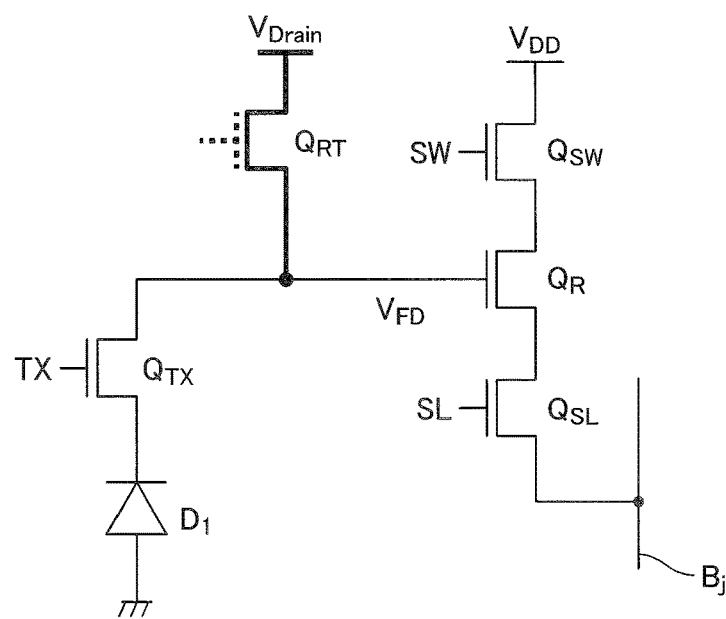
FIG. 27 is a schematic circuit diagram of the semiconductor element according to the second modification of the first embodiment.
Figure 28:
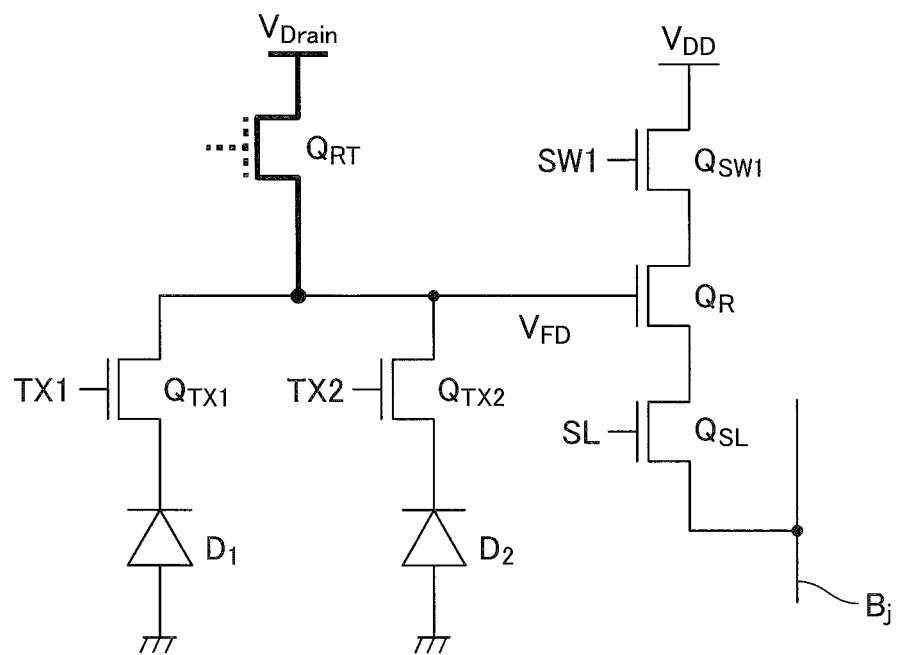
FIG. 28 is a schematic circuit diagram of the semiconductor element according to the second modification of the first embodiment.

Furthermore, as illustrated in FIG. 26, the semiconductor element may include a switching-transistor $Q_{SW1}$ connected between the power supply $V_{DD}$ and the readout-transistor $Q_R$ and a switching-transistor $Q_{SW2}$ connected between the control signal line having a predetermined voltage $V_R$ and the vertical signal line $B_j$ in addition to the two photodiodes $D_1$ and $D_2$ and the two transfer transistors $Q_{TX1}$ and $Q_{TX2}$ connected to the two photodiodes $D_1$ and $D_2$. Moreover, as illustrated in FIG. 27, the switching-transistor $Q_{SW2}$ may be removed from the structure illustrated in FIG. 24. As illustrated in FIG. 28, the switching-transistor $Q_{SW2}$ may be removed from the structure illustrated in FIG. 26.

(Second Embodiment)

Figure 29:
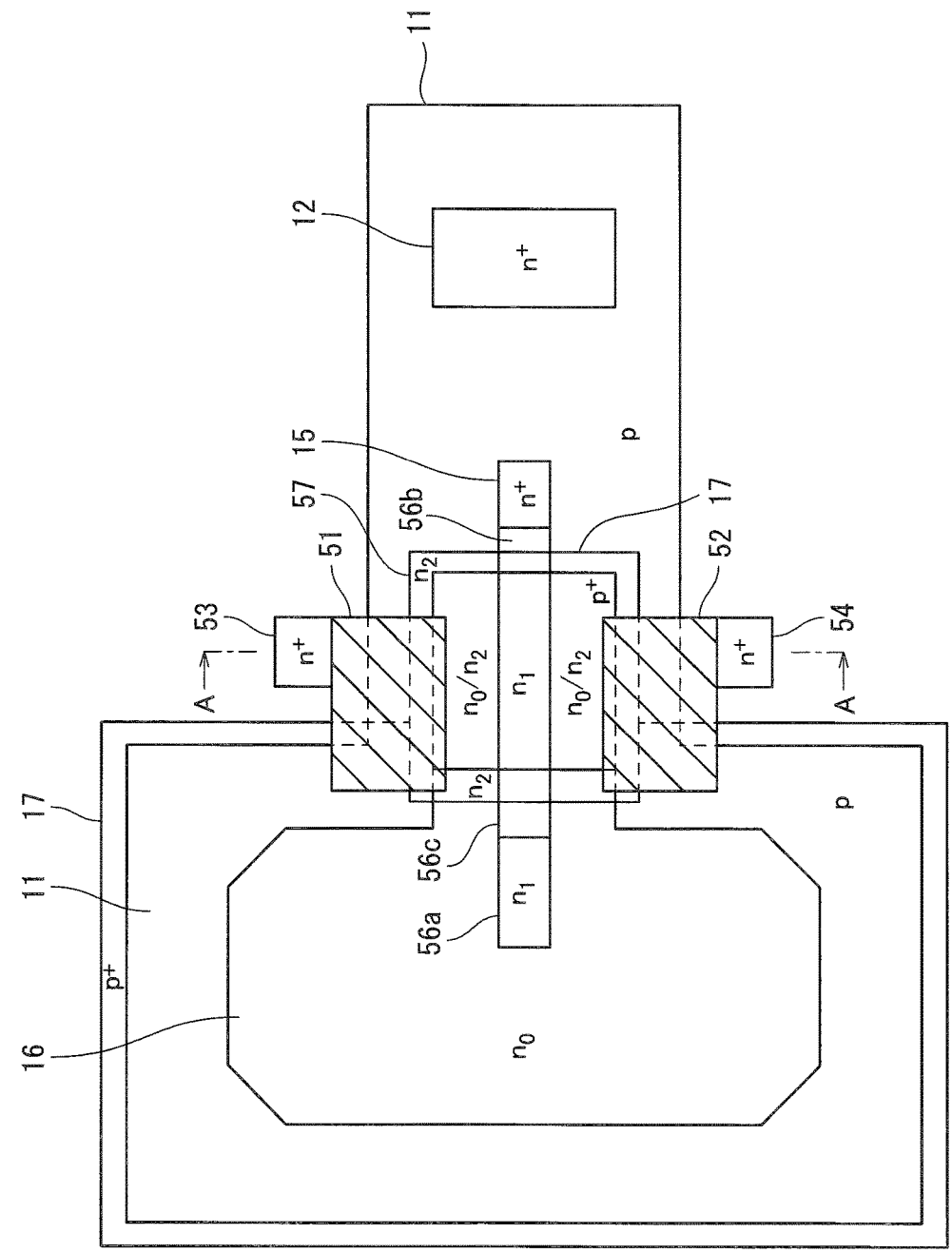
FIG. 29 is a schematic plan view illustrating a structure of a semiconductor element of a solid-state imaging device according to the second embodiment.
Figure 30A:
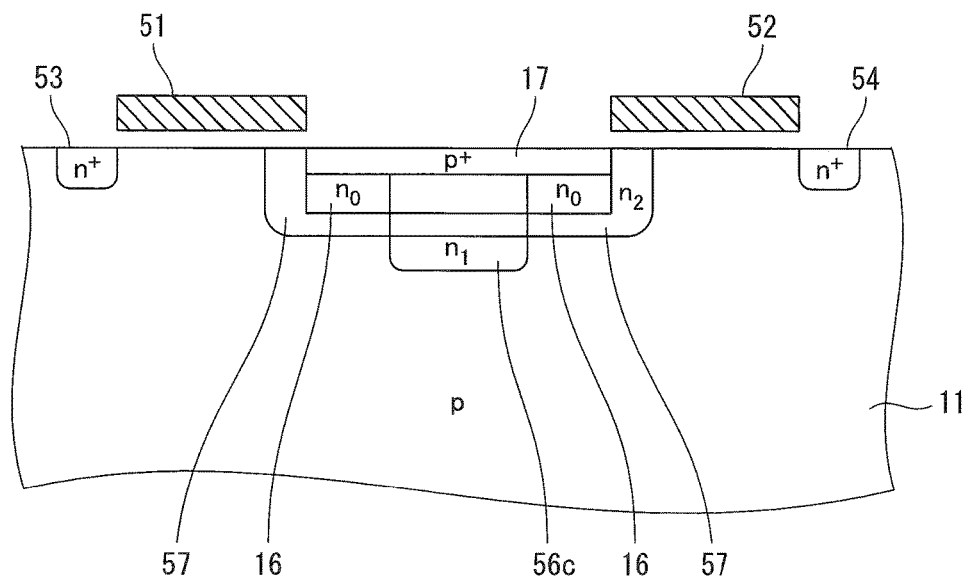
FIG. 30A is a schematic cross-sectional view seen from the direction A-A in FIG. 29.

An entire structure of a solid-state imaging device according to a second embodiment of the present invention is substantially the same as the structure illustrated in FIG. 1, and redundant description will be omitted. A semiconductor element that forms a pixel $X_{ij}$ of the solid-state imaging device according to the second embodiment is different from the semiconductor element according to the first embodiment in that as illustrated in FIG. 30A, which corresponds to the plan view of FIG. 29. Because FIG. 30A is the cross-sectional view seen from the direction A-A in FIG. 29, a lateral field-control transistor having a pair of lateral field-control gate electrodes 51 and 52 is provided, and a transfer channel is provided between the pair of lateral field-control gate electrodes 51 and 52. As illustrated in FIG. 29, the pair of lateral field-control gate electrodes 51 and 52 are disposed symmetrically so as to sandwich the transfer channel between the buried charge-generation region 16 and the charge-readout region 15.

As illustrated in the cross-sectional view of FIG. 30A, a n-type transfer channel 56c having a narrower width than the buried charge-generation region 16 and a n-type semiconductor region 57 having a wider width than the buried charge-generation region 16 are buried in an upper portion of the semiconductor region 11 between the lateral field-control gate electrodes 51 and 52. As can be understood from the plan view of FIG. 29, a charge-guiding region 56b that guides charges transferred from the buried charge-generation region 16 to the charge-readout region 15 is provided on the right side of the transfer channel 56c and the charge-guiding region 56b is in contact with the charge-readout region 15. An n-type charge-guiding portion 56a that guides charges from the buried charge-generation region 16 to the transfer channel 56c is provided on the left side of the transfer channel 56c, and $n^+$-type semiconductor regions 53 and 54 are buried in an upper portion of the semiconductor region 11 on the opposite side of the side adjacent to the lateral field-control gate electrodes 51 and 52. As illustrated in FIG. 30A, the bottom of the semiconductor region 57 is deeper than the bottom of the buried charge-generation region 16, and the bottom of the transfer channel 56c is deeper than the bottom of the semiconductor region 57. For example, an impurity concentration $n_2$ of the semiconductor region 57 is set to be lower than an impurity concentration $n_0$ of the buried charge-generation region 16, and the impurity concentration $n_1$ of the charge-guiding portion 56a, the transfer channel 56c, and the charge-guiding region 56b is set to be higher than the impurity concentration $n_0$ of the buried charge-generation region 16 and the impurity concentration $n_2$ of the semiconductor region 57. The relationship between the magnitudes of the impurity concentration $n_2$ of the semiconductor region 57, the impurity concentration $n_0$ of the buried charge-generation region 16, and the impurity concentration $n_1$ of the charge-guiding portion 56a, the transfer channel 56c, and the charge-guiding region 56b is not limited to the above mentioned relationship.

Figure 30B:
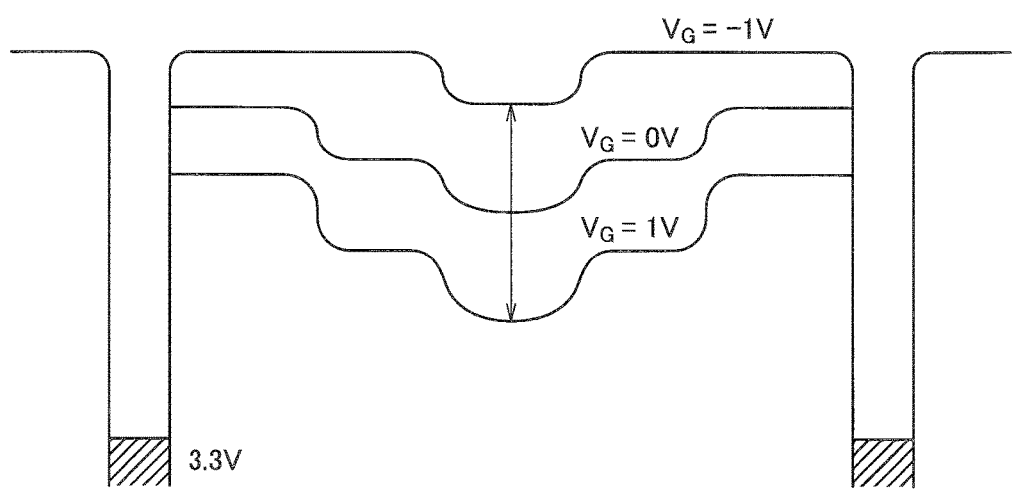
FIG. 30B is a potential diagram corresponding to FIG. 30A.

As illustrated in FIG. 30B, potential profiles, each having steps representing the potentials at the buried charge-generation region 16, the transfer channel 56c, and the semiconductor region 57, are created. When the voltages $V_G$ applied to the lateral field-control gate electrodes 51 and 52 are equally changed to −1 volt, 0 volt, and +1 volt, each of the potential profiles changes while keeping the respective shape with relative steps. The potential of the transfer channel 56c sandwiched between the lateral field-control gate electrodes 51 and 52 can be controlled by the voltage of the lateral field-control gate electrodes 51 and 52 and charges can be transferred from the buried charge-generation region 16 to the charge-guiding region 56b.

Figure 31:
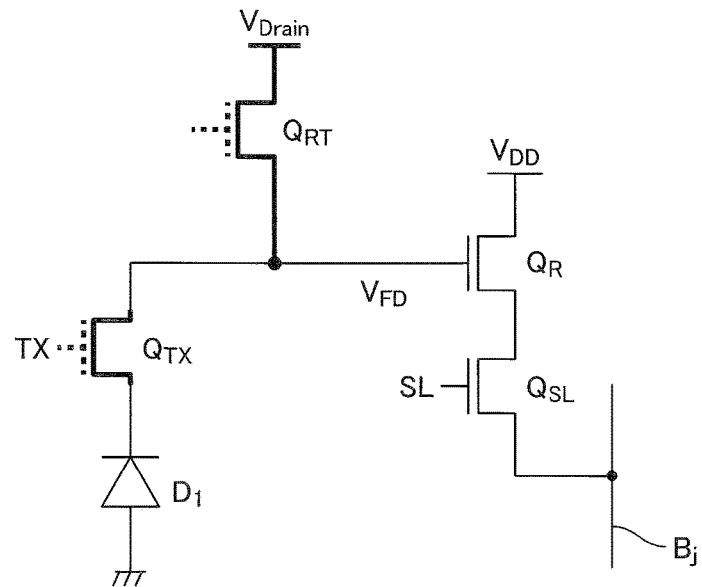
FIG. 31 is an equivalent circuit diagram of the semiconductor element according to the second embodiment.

FIG. 31 illustrates an equivalent circuit of the semiconductor element according to the second embodiment. In FIG. 31, the lateral field-control transistor $Q_{TX}$ having the pair of lateral field-control gate electrodes 51 and 52 is illustrated as a electronic symbol which represents a gate electrode by a broken line, and the broken line means that the electronic symbol is equivalent to a structure in which a transistor lacking the gate electrode is provided on a transfer channel. A lateral field-control transistor $Q_{TX}$ that the pair of lateral field-control gate electrodes 51 and 52 functions equivalently is virtually connected to the photodiode $D_1$ implemented by the semiconductor region 11 and the buried charge-generation region 16. The gate electrode of the readout-transistor $Q_R$ is connected to a charge-readout region indicated by one of the main electrodes of the lateral field-control transistor $Q_{TX}$ defined by the pair of lateral field-control gate electrodes 51 and 52. The drain region of the readout-transistor $Q_R$ is connected to the power supply $V_{DD}$, and the source region of the readout-transistor $Q_R$ is connected to the drain region of the pixel-selecting switching-transistor $Q_{SL}$. The source region of the switching-transistor $Q_{SL}$ is connected to the vertical signal line $B_j$.

According to the semiconductor element pertaining to the second embodiment, similarly to the first embodiment, when a positive voltage is applied to the reset-performing region 12 illustrated in FIG. 29 and the reset potential barrier between the reset-performing region 12 and the charge-readout region 15 is varied using an electrostatically induced electric field from the reset-performing region 12, the charges in the charge-readout region 15 can be exhausted to the reset-performing region 12, a reset operation can be performed, and a high pixel conversion gain and an ultralow noise can be realized. Furthermore, since the transfer-gate electrode is not disposed immediately above the transfer channel between the buried charge-generation region 16 and the charge-readout region 15, it is possible to further reduce the parasitic capacitance at the periphery of the charge-readout region 15 as compared to the first embodiment.

[Modification of Second Embodiment]

Figure 32:
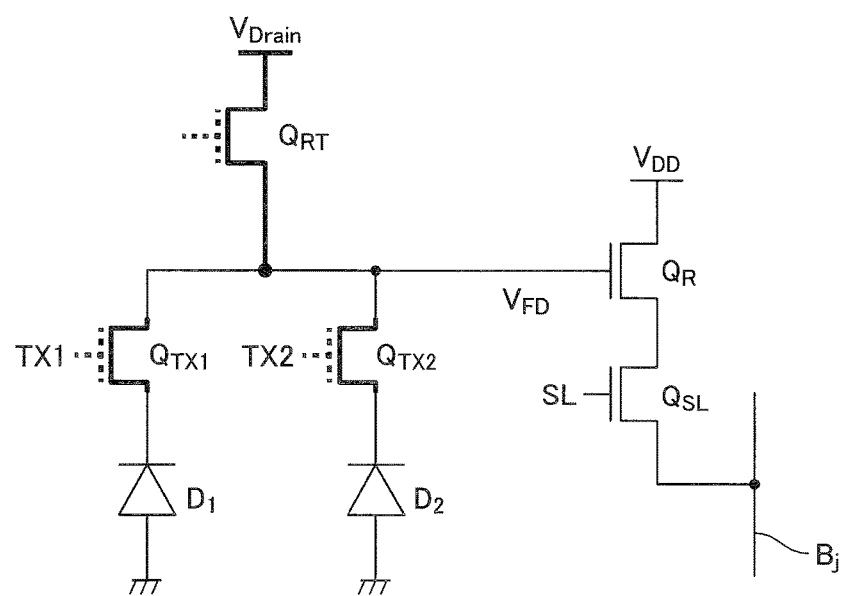
FIG. 32 is a schematic circuit diagram of the semiconductor element according to a modification of the second embodiment.

A modification of the structure of the semiconductor element according to the second embodiment will be described as a modification of the second embodiment. As illustrated in FIG. 32, the semiconductor element may include a plurality of (two) photodiodes $D_1$ and $D_2$ and a plurality of (two) lateral field-control transistors $Q_{TX1}$ and $Q_{TX2}$ connected to the plurality of (two) photodiodes $D_1$ and $D_2$. The lateral field-control transistors $Q_{TX1}$ and $Q_{TX2}$ are disposed to face each other so that a pair of lateral field-control gate electrodes sandwich the transfer channel. The plurality of (two) lateral field-control transistors $Q_{TX1}$ and $Q_{TX2}$ are represented by an electronic symbol which represents a gate electrode by a broken line, meaning that the electronic symbol is equivalent to a transistor body lacking the gate electrode. Since one charge-readout region 15 is provided with respect to the plurality of (two) photodiodes $D_1$ and $D_2$, the size of the respective pixels $X_{ij}$ can be reduced and a high spatial resolution can be realized. The number of combinations of the photodiodes $D_1$ and $D_2$ and the transfer transistors $Q_{TX1}$ and $Q_{TX2}$ may be three or more.

Figure 33:
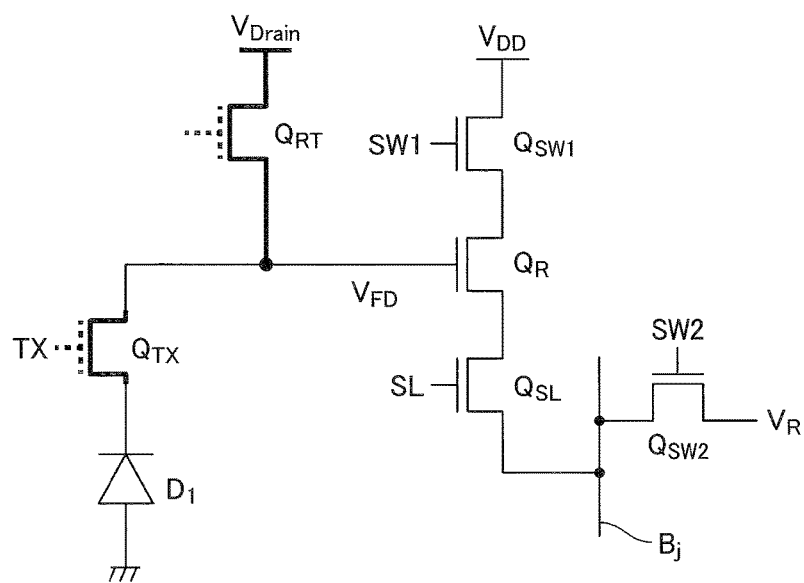
FIG. 33 is a schematic circuit diagram of the semiconductor element according to a modification of the second embodiment.
Figure 34:
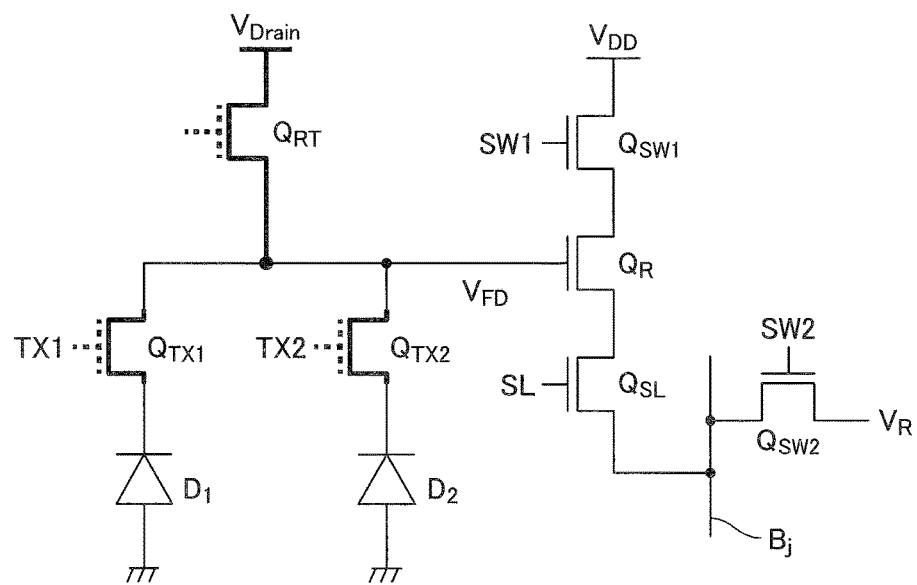
FIG. 34 is a schematic circuit diagram of the semiconductor element according to a modification of the second embodiment.
Figure 35:
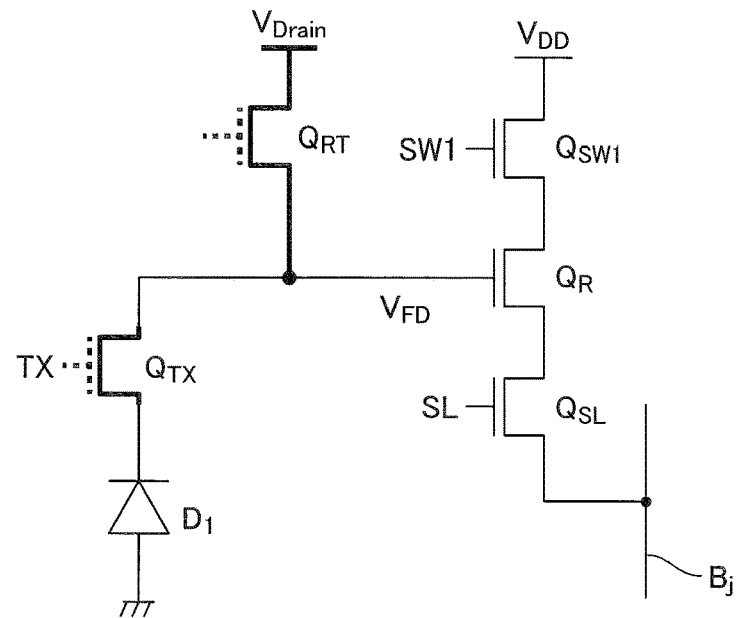
FIG. 35 is a schematic circuit diagram of the semiconductor element according to a modification of the second embodiment.
Figure 36:
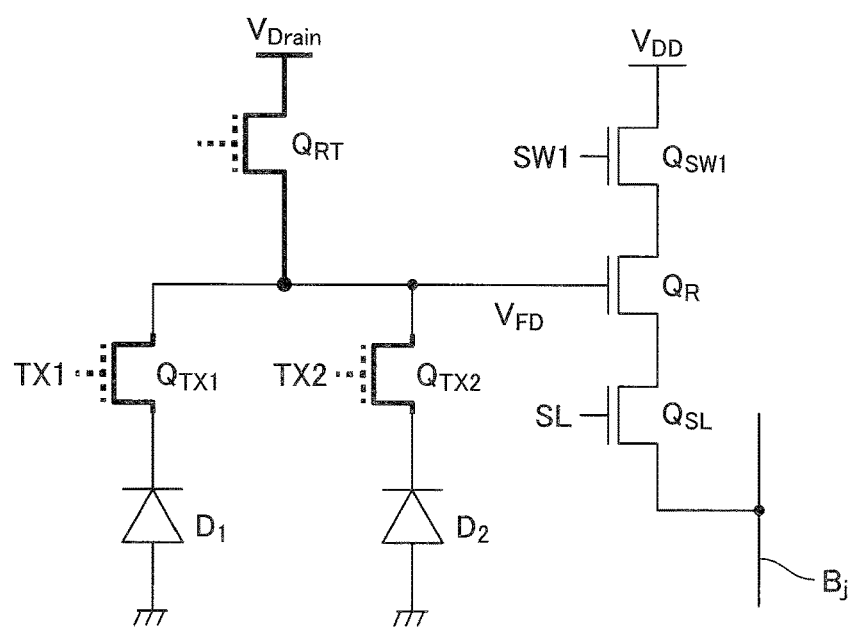
FIG. 36 is a schematic circuit diagram of the semiconductor element according to a modification of the second embodiment.

Furthermore, as illustrated in FIG. 33, the semiconductor element may include a switching-transistor $Q_{SW1}$ connected between the power supply $V_{DD}$ and the readout-transistor $Q_R$ and a switching-transistor $Q_{SW2}$ connected between the control signal line having a predetermined voltage $V_R$ and the vertical signal line $B_j$. Furthermore, as illustrated in FIG. 34, the semiconductor element may include two photodiodes $D_1$ and $D_2$, two lateral field-control transistors $Q_{TX1}$ and $Q_{TX2}$ connected to the two photodiodes $D_1$ and $D_2$, a switching-transistor $Q_{SW1}$ connected between the power supply $V_{DD}$ and the readout-transistor $Q_R$, and a switching-transistor $Q_{SW2}$ connected between the vertical signal line $B_j$ and the control signal line having a predetermined voltage $V_R$. Moreover, as illustrated in FIG. 35, the switching-transistor $Q_{SW2}$ may be removed from the structure illustrated in FIG. 33. As illustrated in FIG. 36, the switching-transistor $Q_{SW2}$ may be removed from the structure illustrated in FIG. 34.

(Third Embodiment)

Figure 37:
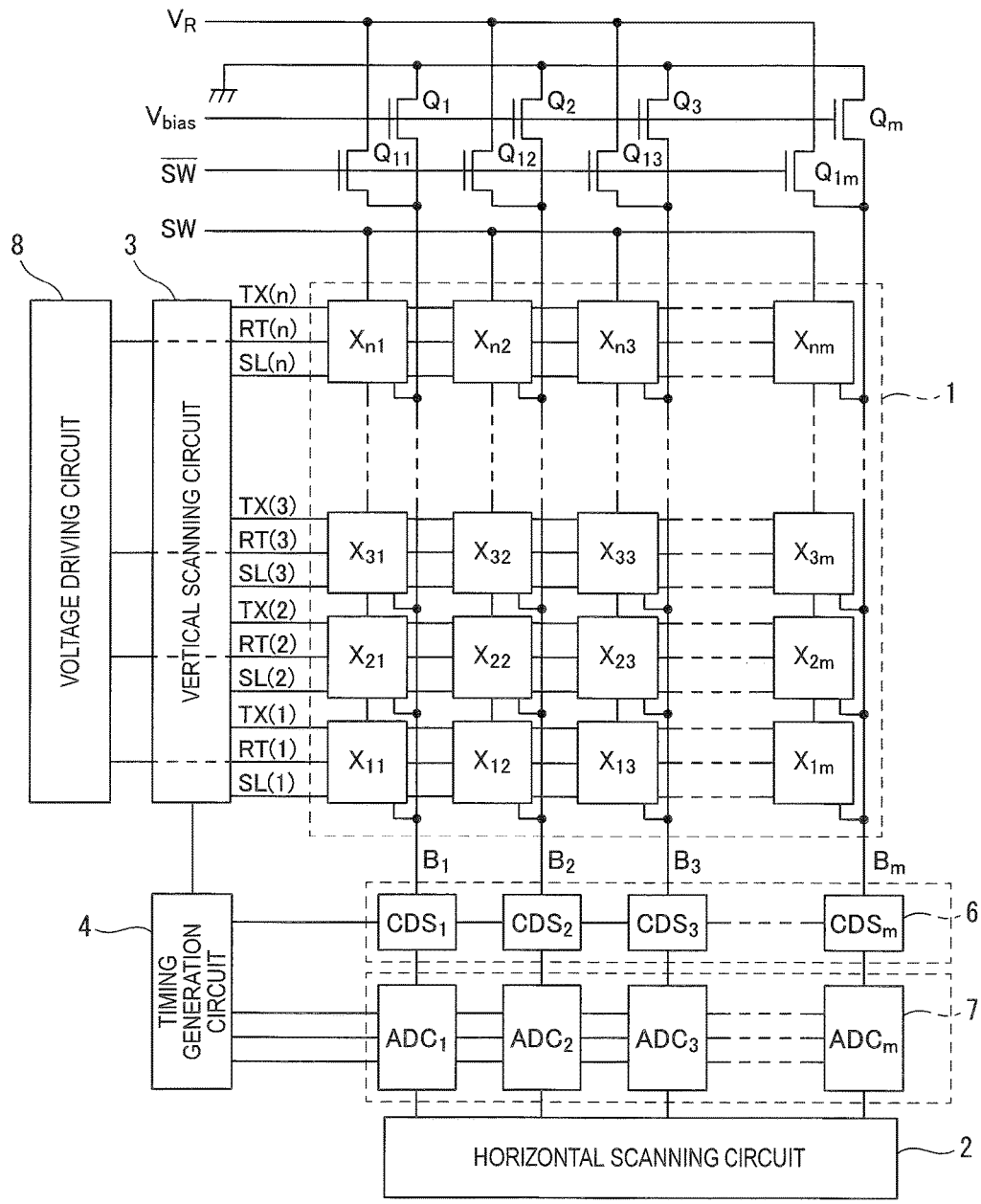
FIG. 37 is a schematic plan view illustrating a layout on a semiconductor chip of a solid-state imaging device according to a third embodiment.
Figure 38:
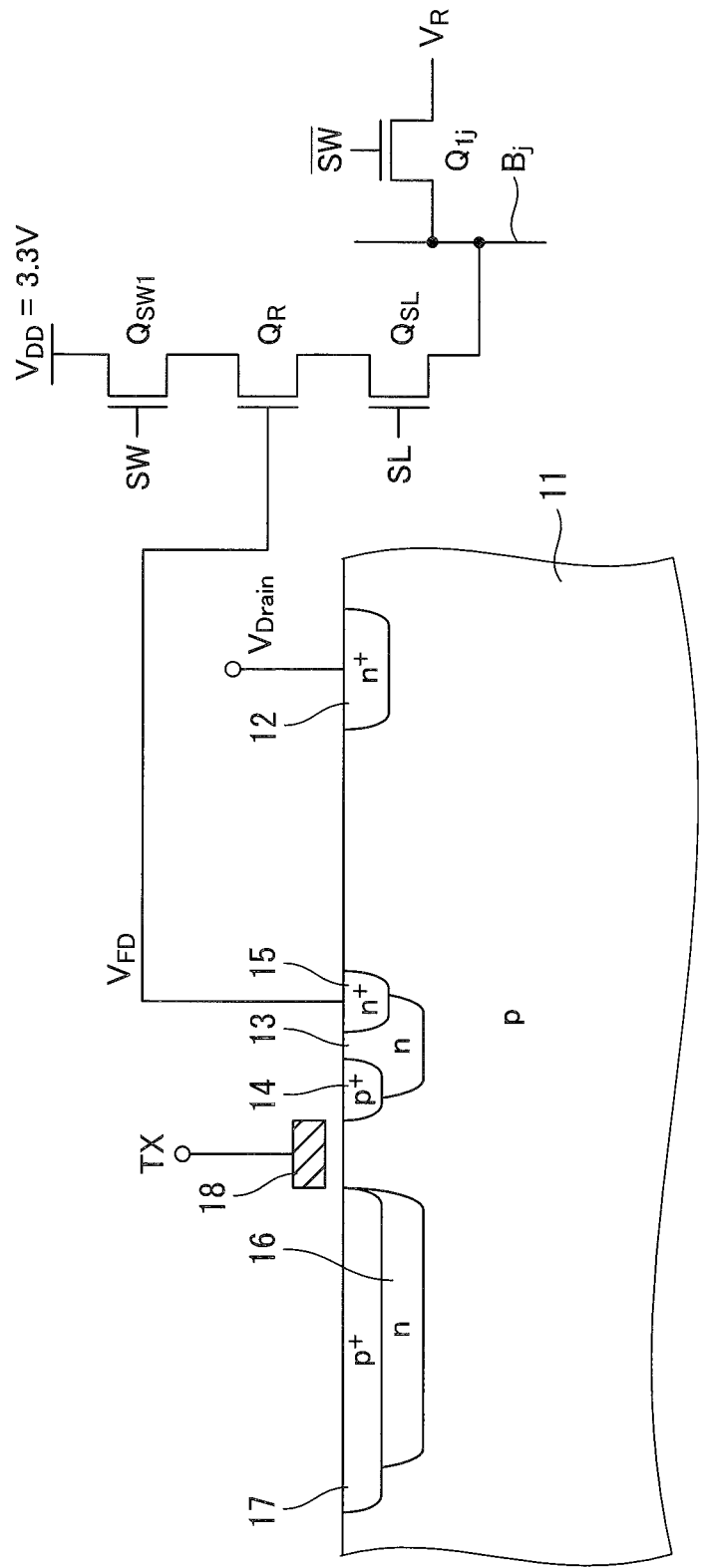
FIG. 38 is a schematic cross-sectional view of a semiconductor element which forms a part of a pixel of the solid-state imaging device according to the third embodiment.

A solid-state imaging device according to a third embodiment of the present invention is different from the structure of the solid-state imaging device according to the first embodiment in that, as illustrated in FIG. 37, switching-transistors $Q_{11}$, $Q_{12}$, $Q_{13}$, . . . , and $Q_{1m}$ are provided in a peripheral circuit outside a pixel $X_{ij}$. As illustrated in FIG. 38, a switching-transistor $Q_{1j}$ of the peripheral circuit outside the pixel $X_{ij}$ is connected to a bit line $B_j$, to which a switching-transistor $Q_{SL}$ constructing a signal-readout circuit of a pixel $X_{ij}$ of a solid-state imaging device according to the third embodiment is connected. The pixel $X_{ij}$ is implemented by a semiconductor element of the third embodiment. A switching-transistor $Q_{SW1}$ is connected to a readout-transistor $Q_R$ that implements the signal-readout circuit of the semiconductor element according to the third embodiment.

Figure 39:
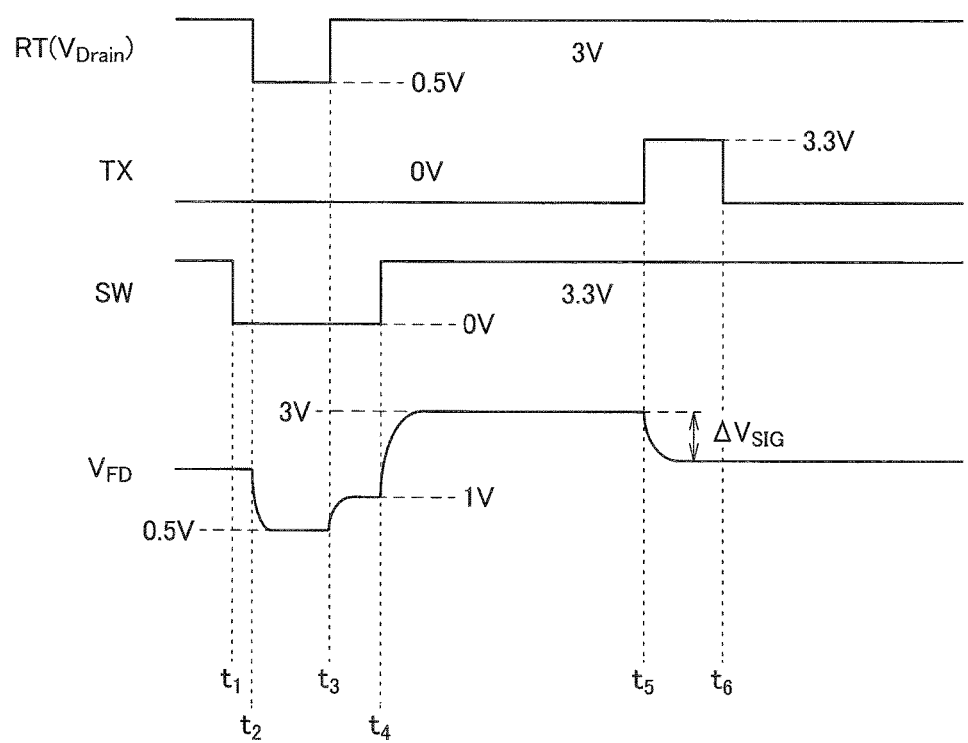
FIG. 39 is a timing chart for describing a readout method of the solid-state imaging device according to the third embodiment.

Next, an example of a readout method of the solid-state imaging device according to the third embodiment will be described with reference to a timing chart of FIG. 39. A readout method of the solid-state imaging device according to the third embodiment corresponds to an operation of a bootstrap described using FIGS. 20 to 23.

(a) At time point t1, the control signal TX applied to the transfer-gate electrode 18 is maintained to the low (L) level (zero volt), and a control signal SW applied to the gate electrode of the switching-transistor $Q_{SW1}$ is put into the low (L) level (zero volt). Since an inverted signal of the control signal SW is applied to the gate electrode of the switching-transistor the switching-transistor is put into the high (H) level. At time point t2, when the reset signal RT applied to the reset-performing region 12 changes from the high (H) level (3 volts) to the low (L) level (0.5 volt), the voltage $V_{FD}$ of the charge-readout region 15 decreases to 0.5 volt.

(b) At time point t3, when the control signal TX and the control signal SW are maintained to the low (L) level and the high (H) level (3 volts) is applied to the reset-performing region 12 as the reset signal RT, the potential of the charge-readout region 15 reaches a readout voltage $V_{FD}$ of 1 volt. This readout voltage $V_{FD}$ of 1 volt is applied to the gate electrode of the readout-transistor $Q_R$.

(c) At time point t4, the control signal SW applied to the switching-transistor $Q_{SW1}$ reaches the high (H) level (3.3 volts) and the switching-transistor $Q_{SW1}$ is turned on. In this case, the potential of the charge-readout region 15 reaches the readout voltage $V_{FD}$ of 3 volts, and the reset of the potential well PW2 of the charge-readout region 15 is completed by the bootstrap effect.

(d) At timings later than time point t4, light is incident on the photodiode of the pixel $X_{ij}$ illustrated in FIG. 38. The photodiode receives the incident light as a light signal and converts the light signal to charges. At time point t5, when the control signal TX applied to the transfer-gate electrode 18 reaches the high (H) level (3.3 volts), the height of the transfer-potential barrier between the potential valley PW1 and the potential well PW2 illustrated in FIG. 7 decreases, and charges are transferred from the buried charge-generation region 16 to the charge-readout region 15 in time points t5 to t6. The potential $V_{FD}$ of the charge-readout region 15 decreases by $\Delta V_{SIG}$, so as to correspond to the amount of charges transferred from the buried charge-generation region 16 to the charge-readout region 15.

(e) In the pixel $X_{ij}$ in which the pixel-selecting switching-transistor $Q_{SL}$ is turned on, a current depending on the gate potential of the readout-transistor (the amplification-transistor) $Q_R$ that forms the signal-readout circuit illustrated in FIG. 38 is read out via the vertical signal line $B_j$.

According to the solid-state imaging device according to the third embodiment, even when the switching-transistors $Q_{11}$, $Q_{12}$, $Q_{13}$, . . . , and $Q_{1m}$ are provided in the peripheral circuit outside the pixel $X_{ij}$, a high pixel conversion gain and an ultralow noise can be realized.

(Fourth Embodiment)

Figure 40:
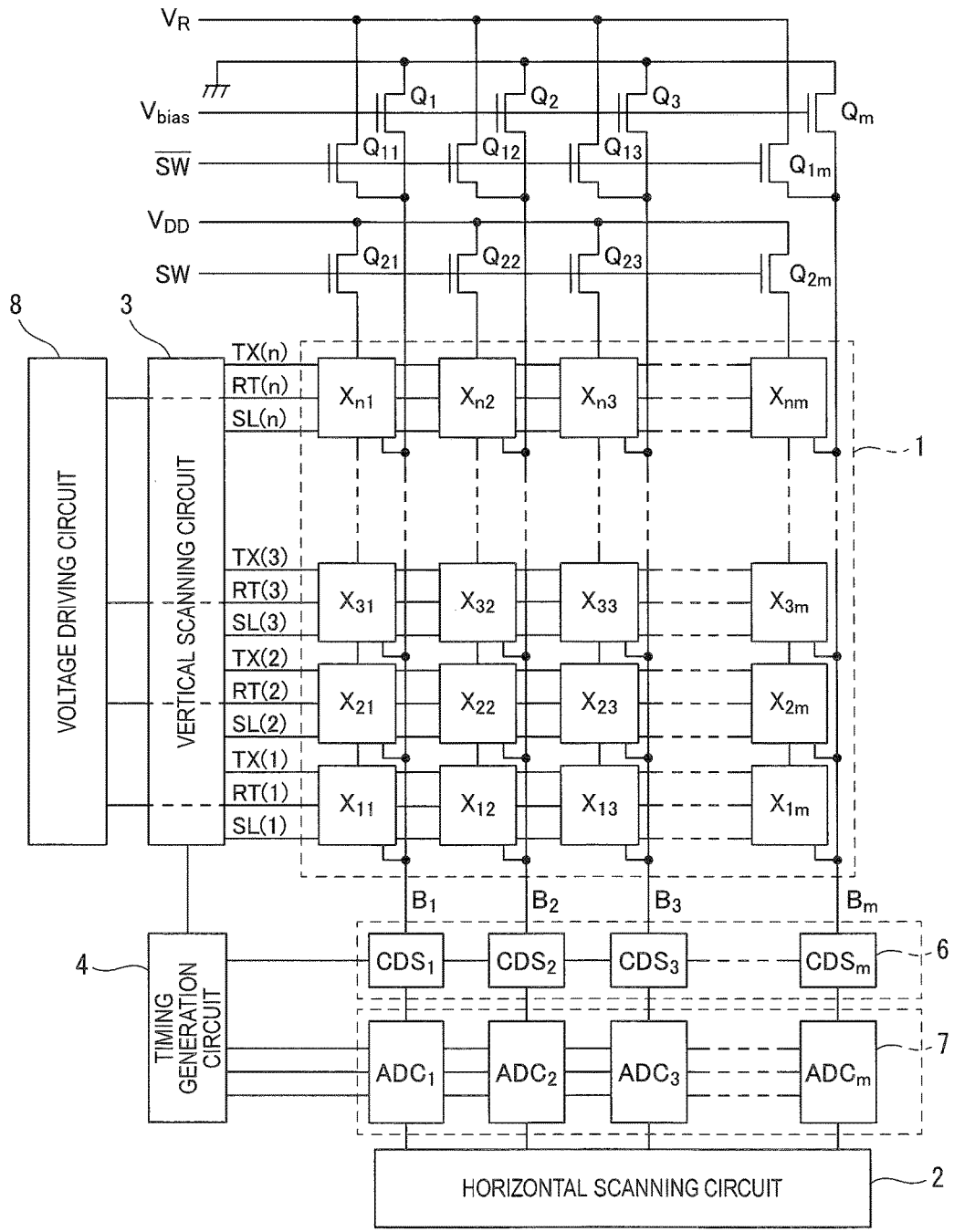
FIG. 40 is a schematic plan view illustrating a layout on a semiconductor chip of a solid-state imaging device according to a fourth embodiment.
Figure 41:
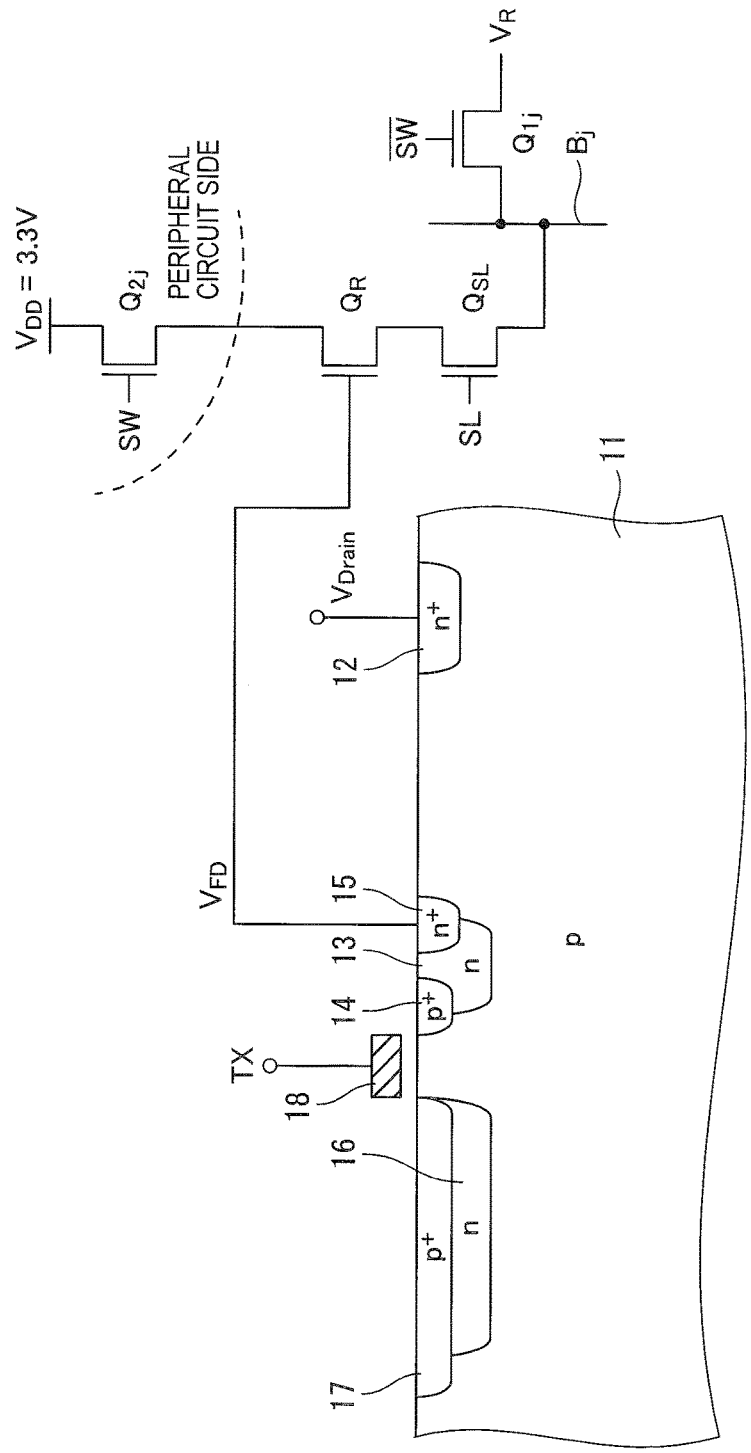
FIG. 41 is a schematic cross-sectional view of a semiconductor element which forms a part of a pixel of the solid-state imaging device according to the fourth embodiment.

A solid-state imaging device according to a fourth embodiment of the present invention is different from the structure of the solid-state imaging device according to the third embodiment of the present invention in that switching-transistors $Q_{11}$, $Q_{12}$, $Q_{13}$, . . . , and $Q_{1m}$ and switching-transistors $Q_{21}$, $Q_{22}$, $Q_{23}$, . . . , and $Q_{2m}$ are provided in the peripheral circuit outside the pixel $X_{ij}$ as illustrated in FIG. 40. As illustrated in FIG. 41, a drain region of a readout-transistor (an amplification-transistor) $Q_R$ that implements a signal-readout circuit of a semiconductor element according to the fourth embodiment is connected to a switching-transistor $Q_{2j}$ which is a peripheral circuit of the pixel $X_{ij}$.

A driving method of a solid-state imaging device according to the fourth embodiment is substantially the same as a driving method of the solid-state imaging device according to the third embodiment. According to the solid-state imaging device according to the fourth embodiment, since the switching-transistors $Q_{11}$, $Q_{12}$, $Q_{13}$, . . . , and $Q_{1m}$ and the switching-transistors $Q_{21}$, $Q_{22}$, $Q_{23}$, . . . , and $Q_{2m}$ are provided in the peripheral circuit outside the pixel the size of the respective pixels $X_{ij}$ can be reduced and a high spatial resolution can be realized.

(Other Embodiments)

As described above, while the present invention has been described above with reference to the first to fourth embodiments, it should be understood that discussion and Drawings which are incorporated herein are not intended to limit the present invention. Various alternative embodiments, examples, and operational techniques will be apparent to those skilled in the art from the description above.

In the description of the solid-state imaging devices according to the first to fourth embodiments, although the first conductivity type is the p-type and the second conductivity type is the n-type, it can be easily understood that the same technical advantages are obtained when electrical polarities are reversed even when the first conductivity type is the n-type and the second conductivity type is the p-type.

Moreover, in the description of the first to fourth embodiments, although a two-dimensional solid-state imaging device (an area sensor) in which a plurality of semiconductor elements of the present invention are arranged two-dimensionally has been described as an example, the semiconductor element of the present invention is not to be intended to be limited to the pixels of the two-dimensional solid-state imaging device only. For example, it can be easily understood from the content of the disclosure that a plurality of semiconductor elements may be arranged one-dimensionally as the pixels of a one-dimensional solid-state imaging device (a line sensor) in which j=m=1 in the two-dimensional matrix illustrated in FIG. 1.

Naturally, the present invention includes many other embodiments not described herein. Therefore, the technical scope of the present invention is determined only by the technical features specifying the present invention prescribed by claims, which is reasonable from the discussion recited in the foregoing description.

INDUSTRIAL APPLICABILITY

The present invention can be used in various imaging devices such as a security camera which utilizes an ultra-high sensitivity, an ultra-high sensitivity on-board camera for applications to a night vision such as a broadcast camera, and a super-resolution biomicroscope camera.

REFERENCE SIGNS LIST $X_{11}$, $X_{12}$, $X_{13}$, $X_{1m}$, $X_{21}$, $X_{22}$, $X_{23}$, $X_{2m}$, $X_{31}$, $X_{32}$, $X_{33}$, $X_{3m}$, $X_{n1}$, $X_{n2}$, $X_{n3}$, $X_{nm}$: Pixel
1: Pixel array unit
2: Horizontal scanning circuit
3: Vertical scanning circuit
4: Timing generation circuit
6: Noise canceling circuit
7: Signal processing circuit
8: Signal readout circuit
11: Semiconductor region
12: Reset-performing region
13, 56b: Charge-guiding region
14, 17: Pinning layer
15: Charge-readout region
16: Buried charge-generation region
18: Transfer-gate electrode
19: Gate insulating film
20: Light-shielding film
21, 23, 25, 27, 33, 34: Surface interconnection
22: Reset interconnection
30: Common region
31, 32: Gate electrode
35: Drain region
37: Source region
41: Switch circuit
42: Switch
43: Adder
44: Sample/hold (S/H) circuit
45: Analog-to-digital converter (ADC)
46: Register
51, 52: Horizontal-field control gate electrode
53, 54, 57: Semiconductor region
56a: Charge introduction portion
56c: Transfer channel

The invention claimed is:

1. A semiconductor element comprising:
a semiconductor region of a first conductivity type;
a buried charge-generation region of a second conductivity type, buried in an upper portion of the semiconductor region to implement a photodiode together with the semiconductor region for generating charges;
a charge-readout functional region of the second conductivity type, disposed in another portion of the semiconductor region to be separated from the buried charge-generation region for accumulating the charges transferred from the buried charge-generation region;
a charge transfer mechanism disposed on the semiconductor region between the buried charge-generation region and the charge-readout functional region, configured to control the transfer of the charges from the buried charge-generation region to the charge-readout functional region;
a reset-performing region of the second conductivity type, configured to be applied with a reset signal, the reset-performing region is disposed in still another portion of the semiconductor region to be spatially separated from a site of the charge-readout functional region; and
a pinning layer of the first conductivity type having a higher impurity concentration than that of the semiconductor region, disposed selectively in still another portion of the semiconductor region in contact with the charge-readout functional region, at a location arranged on a side close to the buried charge-generation region, wherein the location is selectively provided on a side closer to the edge of the charge transfer mechanism such that the pinning layer is not disposed at an area under the charge transfer mechanism, and, as the reset signal, a variable voltage is applied to the reset-performing region so as to change a height of a potential barrier generated in the semiconductor region sandwiched between the charge-readout functional region and the reset-performing region, for exhausting the charges accumulated in the charge-readout functional region.

2. The semiconductor element according to claim 1, wherein the charge-readout functional region includes:
a charge-readout region of the second conductivity type, provided so as to be separated toward the reset-performing region from the pinning layer; and
a charge-guiding region of the second conductivity type having a lower impurity concentration than that of the charge-readout region, provided such that a portion close to the reset-performing region is in contact with the charge-readout region and a portion close to the buried charge-generation region is in contact with the pinning layer.

3. The semiconductor element according to claim 1, wherein the charge-readout functional region is made of a charge-guiding region of the second conductivity type, functioning as a charge-readout region.

4. The semiconductor element according to claim 1, wherein the charge-readout functional region is made of a charge-readout region of the second conductivity type to which the charges are transferred from the buried charge-generation region via a channel portion.

5. A solid-state imaging device in which a plurality of pixels is arranged, each of the pixel comprising:
a semiconductor region of a first conductivity type;
a buried charge-generation region of a second conductivity type, buried in an upper portion of the semiconductor region to implement a photodiode together with the semiconductor region for generating charges;
a charge-readout functional region of the second conductivity type, disposed in another portion of the semiconductor region to be separated from the buried charge-generation region for accumulating the charges transferred from the buried charge-generation region;
a charge transfer mechanism disposed on the semiconductor region between the buried charge-generation region and the charge-readout functional region to control the transfer of the charges from the buried charge-generation region to the charge-readout functional region;

a reset-performing region of the second conductivity type, configured to be applied with a reset signal, the reset-performing region is disposed in still another portion of the semiconductor region to be spatially separated from a site of the charge-readout functional region; and a pinning layer of the first conductivity type having a higher impurity concentration than that of the semiconductor region, provided selectively in an upper portion of the semiconductor region in contact with the charge-readout functional region, at a location arranged on a side close to the buried charge-generation region, wherein the location is selectively provided on a side closer to the edge of the charge transfer mechanism such that the pinning layer is not disposed at an area under the charge transfer mechanism, and, as the reset signal, in each of the pixels, a variable voltage is applied to the reset-performing region so as to change a height of a potential barrier generated in the semiconductor region sandwiched between the charge-readout functional region and the reset-performing region, for exhausting the charges accumulated in the charge-readout functional region.

6. The solid-state imaging device according to claim 5, wherein the charge-readout functional region includes:

a charge-readout region of the second conductivity type, provided so as to be separated toward the reset-performing region from the pinning layer; and a charge-guiding region of the second conductivity type having a lower impurity concentration than that of the charge-readout region, provided such that a portion close to the reset-performing region is in contact with the charge-readout region and a portion close to the buried charge-generation region is in contact with the pinning layer.

7. The solid-state imaging device according to claim 5, wherein the charge-readout functional region is made of a charge-guiding region of the second conductivity type, functioning as a charge-readout region.

8. The solid-state imaging device according to claim 5, wherein the charge-readout functional region is made of a charge-readout region of the second conductivity type to which the charges are transferred from the buried charge-generation region via a channel portion.

9. The solid-state imaging device according to claim 5, wherein the charge-readout functional region is connected to a gate electrode of a readout-transistor provided in each of the pixels.

10. The solid-state imaging device according to claim 9, wherein a first switching-transistor is provided in each of the pixels between a power supply and a drain region of the readout-transistor, a second switching-transistor is provided in each of the pixels between a vertical signal line and a control signal line having a predetermined voltage, and the variable voltage and the states of the vertical signal line, the first switching-transistor, the readout-transistor, and the second switching-transistor are changed, whereby the charges accumulated in the charge-readout functional region are exhausted.

11. The solid-state imaging device according to claim 10, wherein the potential of the charge-readout functional region is changed using a gate capacitance of the readout-transistor as a bootstrap capacitance, whereby the charges accumulated in the charge-readout functional region are exhausted.

12. The solid-state imaging device according to claim 11, wherein in an operation of exhausting the charges accumulated in the charge-readout functional region, the first switching-transistor is turned off, the second switching-transistor is turned on, and a source region of the readout-transistor is put into a ground potential, a first voltage is applied to the reset-performing region as the variable voltage to set the reset-performing region to a first constant potential lower than the potential of the charge-readout functional region to supply charges to the reset-performing region over the potential barrier, and the potential of the charge-readout functional region is set to the first potential, a second voltage is applied to the reset-performing region as the variable voltage to set the reset-performing region to a second constant potential higher than a potential that the charge-readout functional region has in a readout operation, the height of the potential barrier is changed, and the potential of the charge-readout functional region is set to a third potential the same as the potential of the potential barrier, and the first switching-transistor is turned on, the second switching-transistor is turned off, and the potential of the charge-readout functional region equivalent to the potential of the gate of the readout-transistor is set to a potential necessary for exhausting charges using the gate capacitance of the readout-transistor as a bootstrap capacitance.

* * * * *